(12) United States Patent
Shimakawa

(10) Patent No.: US 10,418,302 B2
(45) Date of Patent: Sep. 17, 2019

(54) CONTROL UNIT AND ELECTRIC POWER STEERING DEVICE

(71) Applicant: NSK Ltd., Tokyo (JP)

(72) Inventor: Shigeru Shimakawa, Tokyo (JP)

(73) Assignee: NSK LTD., Tokyo (JP)

( * ) Notice: Subject to any disclaimer, the term of this patent is extended or adjusted under 35 U.S.C. 154(b) by 0 days.

(21) Appl. No.: 15/777,382

(22) PCT Filed: Nov. 24, 2016

(86) PCT No.: PCT/JP2016/084825
§ 371 (c)(1),
(2) Date: May 18, 2018

(87) PCT Pub. No.: WO2017/094589
PCT Pub. Date: Jun. 8, 2017

(65) Prior Publication Data
US 2018/0331012 A1    Nov. 15, 2018

(30) Foreign Application Priority Data

Nov. 30, 2015 (JP) .................. 2015-233666
Aug. 9, 2016 (JP) .................. 2016-156946
Nov. 11, 2016 (JP) .................. 2016-220766

(51) Int. Cl.
*H01L 23/34* (2006.01)
*H01L 23/367* (2006.01)
(Continued)

(52) U.S. Cl.
CPC ...... *H01L 23/3675* (2013.01); *B60R 16/0231* (2013.01); *B62D 5/04* (2013.01);
(Continued)

(58) Field of Classification Search
CPC . H01L 23/3675; H01L 23/36; B60R 16/0231; H05K 1/0201; H05K 7/209
(Continued)

(56) References Cited

U.S. PATENT DOCUMENTS 5,625,227 A * 4/1997 Estes .................. H01L 23/3675
                                                     257/712
5,923,084 A * 7/1999 Inoue .................. H01L 23/3121
                                                     257/712
(Continued)

FOREIGN PATENT DOCUMENTS

JP    2002-222897 A    8/2002
JP    2004-214460 A    7/2004
(Continued)

OTHER PUBLICATIONS

International Search Report of PCT/JP2016/084825 dated Feb. 7, 2017 [PCT/ISA/210].
(Continued)

*Primary Examiner* — Nitin Parekh
(74) *Attorney, Agent, or Firm* — Sughrue Mion, PLLC

(57) ABSTRACT

Provided are a heat dissipation substrate capable of improving heat dissipation properties of an electronic component, and an electric power steering device. In the heat dissipation substrate, a plurality of thermal vias are disposed at least in an electronic component projection region in which a region of a bottom surface portion of the electronic component is projected to a mounting surface in a direction perpendicular to the mounting surface, and a surface density of the thermal vias which occupy the mounting surface per unit area is at least partially different. The plurality of thermal vias are disposed so that the surface density of the thermal vias becomes the greatest in a dense region on an inner side of an edge portion of the electronic component projection region.

8 Claims, 22 Drawing Sheets

(51) Int. Cl.
*B62D 5/04* (2006.01)
*H01L 23/12* (2006.01)
*H01L 23/36* (2006.01)
*H05K 1/02* (2006.01)
*B60R 16/023* (2006.01)
*H05K 7/20* (2006.01)
*H01L 23/00* (2006.01)

(52) U.S. Cl.
CPC .............. *H01L 23/12* (2013.01); *H01L 23/36* (2013.01); *H05K 1/02* (2013.01); *H05K 7/209* (2013.01); *H01L 24/32* (2013.01); *H01L 24/33* (2013.01); *H01L 2224/32245* (2013.01); *H01L 2224/33181* (2013.01); *H01L 2924/13055* (2013.01); *H01L 2924/13091* (2013.01)

(58) Field of Classification Search
USPC ......................................... 257/706, 712, 713
See application file for complete search history.

(56) References Cited

U.S. PATENT DOCUMENTS

| | | | | |
|---|---|---|---|---|
| 5,990,550 | A * | 11/1999 | Umezawa | H01L 23/367 257/697 |
| 6,008,536 | A * | 12/1999 | Mertol | H01L 23/367 257/704 |
| 6,175,497 | B1 * | 1/2001 | Tseng | H01L 23/36 257/706 |
| 6,455,930 | B1 * | 9/2002 | Palanisamy | H01S 5/02248 174/252 |
| 6,591,897 | B1 | 7/2003 | Bhatti et al. | |
| 7,230,334 | B2 * | 6/2007 | Andry | H01L 23/473 257/713 |
| 7,808,097 | B2 * | 10/2010 | Wang | C03C 8/02 257/432 |
| 2002/0149102 | A1 * | 10/2002 | Hashemi | H01L 23/3677 257/706 |
| 2003/0128522 | A1 * | 7/2003 | Takeda | H01L 23/345 361/715 |
| 2004/0173898 | A1 | 9/2004 | Ito et al. | |
| 2006/0246621 | A1 * | 11/2006 | Crippen | H01L 23/36 438/106 |
| 2009/0115050 | A1 | 5/2009 | Kasuya et al. | |
| 2009/0260858 | A1 | 10/2009 | Nakai et al. | |
| 2011/0156228 | A1 | 6/2011 | Kobayashi et al. | |
| 2012/0007132 | A1 | 1/2012 | Chang et al. | |
| 2015/0255429 | A1 * | 9/2015 | Katkar | H01L 25/0657 257/712 |

FOREIGN PATENT DOCUMENTS

| | | |
|---|---|---|
| JP | 2006-114606 A | 4/2006 |
| JP | 2008-010584 A | 1/2008 |
| JP | 2008-182184 A | 8/2008 |
| JP | 2011-14722 A | 1/2011 |
| JP | 2012-231061 A | 11/2012 |
| JP | 2014-170835 A | 9/2014 |
| JP | 2015-018857 A | 1/2015 |

OTHER PUBLICATIONS

Communication dated Jun. 5, 2018 from the Japanese Patent Office in counterpart Application No. 2017-553807.
Communication dated Aug. 6, 2019 from the European Patent Office in counterpart application No. 16870526.7.

* cited by examiner

CONTROL UNIT AND ELECTRIC POWER STEERING DEVICE

CROSS REFERENCE TO RELATED APPLICATIONS

This application is a National Stage of International Application No. PCT/JP2016/084825, filed Nov. 24, 2016, claiming priorities based on Japanese Patent Application Nos. 2015-233666, filed Nov. 30, 2015, 2016-156946, filed Aug. 9, 2016 and 2016-220766, filed Nov. 11, 2016.

FIELD

The present invention relates to a heat dissipation substrate and an electric power steering device.

BACKGROUND

Patent Literature 1 discloses a composite substrate which includes a ceramic wiring substrate and a heat dissipation substrate, and on which a heat generation element such as a transistor, a diode, a thyristor, and a high-speed and high-output integrated circuit element is mounted.

Patent Literature 2 discloses an electronic component module that is suitable for mounting an electronic component generating heat and a method of manufacturing the electronic component module.

Patent Literature 3 discloses a high heat dissipation substrate having heat conductivity in a substrate thickness direction.

CITATION LIST

Patent Literature

Patent Literature 1: JP 2008-10584 A
Patent Literature 2: JP 2012-231061 A
Patent Literature 3: JP 2015-18857 A

SUMMARY

Technical Problem

The heat dissipation performance of the heat dissipation substrates described in Patent Literature 1 to Patent Literature 3 is not sufficient yet, and there is a demand for a further improvement in the heat dissipation performance and the like.

The invention has been made in consideration of the above-described situation, and an object thereof is to provide a heat dissipation substrate capable of improving heat dissipation properties of an electronic component, and an electric power steering device.

Solution to Problem

As a first embodiment of the present invention for solving the above-described problem and achieving the object, a heat dissipation substrate on which an electronic component is mounted is disclosed. The heat dissipation substrate includes a substrate including a mounting surface on which the electronic component is mounted, and a rear surface of the mounting surface, and a plurality of thermal vias which passes through the heat dissipation substrate between the mounting surface and the rear surface. At least the plurality of thermal vias is disposed in an electronic component projection region projected to the mounting surface in a direction in which a region of a bottom surface portion of the electronic component is perpendicular to the mounting surface, a surface density of the thermal vias which occupies the mounting surface per unit area is at least partially different, and the plurality of thermal vias is disposed so that the surface density of the thermal vias becomes the greatest at a dense portion on an inner side of an edge portion of the electronic component projection region.

According to the above-described configuration, the amount of heat received from a mounting surface at a time increases, and thus it is possible to improve heat dissipation properties of an electronic component.

As a preferable embodiment of the present invention, an interval between the thermal vias adjacent to each other becomes gradually wider from an inner side of the electronic component projection region to an outer side of the electronic component projection region.

According to the above-described configuration, balance between a shortest distance from the heat generation center on a bottom surface portion of an electronic component, and a heat dissipation area is obtained, and thus the heat dissipation properties of the electronic component are improved.

As a preferable embodiment of the present invention, an interval between the thermal vias which are disposed on an inner side of the electronic component projection region and are adjacent to each other is smaller than an interval between the thermal vias which are disposed on an outer side of the electronic component projection region and are adjacent to each other.

According to the above-described configuration, in a case where a temperature of the mounting surface is low, heat of the mounting surface is conducted in a substrate thickness direction by the thermal vias in a dense portion. In a case where the temperature of the mounting surface is high, heat of the mounting surface is conducted in the substrate thickness direction by the thermal vias which exist at the periphery of the dense portion, and the amount of heat received from the mounting surface at a time increases.

As a preferable embodiment of the present invention, an interval between the thermal vias adjacent to each other in a first direction from an inner side of the electronic component projection region to an outer side of the electronic component projection region is the same in each case, and an interval of the thermal vias adjacent to each other in a second direction, becomes gradually wider, the second direction intersecting the first direction and being from the inner side of the electronic component projection region to the outer side.

According to the above-described configuration, in a case where the temperature of the mounting surface is low, heat of the mounting surface is conducted in the substrate thickness direction by the thermal vias in the dense portion. In a case where the temperature of the mounting surface is high, heat of the mounting surface is conducted in the substrate thickness direction by thermal vias in a second direction from an inner side to an outer side of an electronic component projection region at the periphery of the dense portion, and the amount of heat received from the mounting surface at a time increases.

As a preferable embodiment of the present invention, the dense portion overlaps the geometrical center of the electronic component projection region in a plan view, and in a portion that is further spaced away from the geometrical center in comparison to the dense portion, the surface density of the thermal vias is smaller than the surface density of the thermal vias in the dense portion.

According to the above-described configuration, in a case where the temperature of the mounting surface is low, heat of the mounting surface is conducted in the substrate thickness direction by the thermal vias in the dense portion. In a case where the temperature of the mounting surface is high, heat of the mounting surface is conducted in the substrate thickness direction at a portion spaced away from the geometrical center, and the amount of heat received from the mounting surface at a time increases.

As a preferable embodiment of the present invention, the dense portion overlaps the geometrical center of the electronic component projection region in a plan view, and the further a location is spaced away from the geometrical center, the smaller the surface density of the thermal vias becomes.

According to the above-described configuration, in a case where the temperature of the mounting surface is high, heat of the mounting surface is conducted in the substrate thickness direction at a portion spaced away from the geometrical center, and the amount of heat received from the mounting surface at a time increases.

As a preferable embodiment of the present invention, the electronic component includes a heat spreader, and the region of the bottom surface portion of the electronic component is a region of the heat spreader.

According to the above-described configuration, a projection region of the heat spreader becomes a heat dissipation area, and heat is efficiently dissipated.

As a preferable embodiment of the present invention, the thermal vias which exist at the periphery of the dense portion are located in the vicinity of an outer edge of the heat spreader and on an inner side of the projection region of the heat spreader.

According to the above-described configuration, the projection region of the heat spreader becomes an effective heat dissipation area up to the outer edge, and heat is efficiently dissipated.

As a preferable embodiment of the present invention, a total increased area of a conductor foil which increases due to the plurality of thermal vias is 50 mm$^2$ or greater with respect to an area of 100 mm$^2$ in the mounting surface.

According to the above-described configuration, temperature rise of the electronic component is suppressed, and even in a case where a drive elapse time of the electronic component is different, heat is efficiently dissipated.

As a preferable embodiment of the present invention, an inner diameter of the thermal vias is equal to or less than the thickness of the substrate.

According to the above-described configuration, it is possible to enhance a heat dissipation effect of the mounting surface of the electronic component, and the temperature rise of the mounting surface can be suppressed to be lower.

As a preferable embodiment of the present invention, the plurality of thermal vias includes thermal vias having inner diameters different from each other.

According to the above-described configuration, in a case where the temperature of the mounting surface is low, heat of the mounting surface is conducted in the substrate thickness direction by thermal vias having a large inner diameter. In a case where the temperature of the mounting surface is high, heat of the mounting surface is conducted in the substrate thickness direction by thermal vias which exist at the periphery of the dense portion and have a small inner diameter, and the amount of heat received from the mounting surface at a time increases.

As a preferable embodiment of the present invention, when an arrangement interval of the thermal vias adjacent to each other increases, an inner diameter of the thermal vias decreases.

According to the above-described configuration, even in a heat generation distribution having a large temperature difference between a region in which the amount of heat generation of the bottom surface of the electronic component is large, and a region in which the amount of heat generation of the bottom surface of the electronic component is small, it is possible to improve heat dissipation properties of the electronic component.

As a preferable embodiment of the present invention, a copper foil increased area due to one of the plurality of thermal vias is great at the geometrical center of the electronic component projection region, and decreases as the thermal via is further spaced away from the geometrical center of the electronic component projection region.

According to the above-described configuration, in a case where the temperature of the mounting surface is low, heat of the mounting surface is conducted in the substrate thickness direction by thermal vias of which a copper foil increased area per one piece is large. In a case where the temperature of the mounting surface is high, heat of the mounting surface is conducted in the substrate thickness direction by thermal vias of which a copper foil increased area per one piece is small and which exist at the periphery of the dense portion, and the amount of heat received from the mounting surface at a time increases.

As a preferable embodiment of the present invention, the substrate is a multi-layer substrate, and a heat conductive material and a heat sink are provided on the rear surface, and heat conducted from the plurality of thermal vias is conducted to the heat sink through the heat conductive material.

According to the above-described configuration, heat is efficiently conducted to a heat sink from the electronic component through the thermal vias.

As a second embodiment of the present invention for solving the above-described problem and achieving the object, an electronic power steering device is disclosed. The electric power steering device includes the above-described heat dissipation substrate mounted thereon.

According to the above-described configuration, in a case where a rank end edge or driving wheels interfere with a curbstone and the like, the temperature of the mounting surface of the electronic component greatly varies. In a case where the temperature of the mounting surface is low, heat of the mounting surface is conducted in the substrate thickness direction by the thermal vias in the dense portion. In a case where the temperature of the mounting surface is high, heat of the mounting surface is conducted in the substrate thickness direction by the thermal vias in a second direction from an inner side to an outer side of an electronic component projection region at the periphery of the dense portion, and the amount of heat received from the mounting surface at a time increases. According to this, failure of the control unit is suppressed.

Advantageous Effects of Invention

According to the invention, it is possible to provide a heat dissipation substrate capable of improving heat dissipation properties of an electronic component, and an electric power steering device.

BRIEF DESCRIPTION OF DRAWINGS

FIG. 29 is a plan view illustrating arrangement of the thermal vias in Evaluation Example a.

DESCRIPTION OF EMBODIMENTS

An aspect for carrying out the invention (embodiment) will be described in detail with reference to the accompanying drawings. The invention is not limited by contents described in the embodiment. In addition, the following constituent elements include a matter that is substantially the same constituent element and a matter that can be easily assumed by those skilled in the art. In addition, the following constituent elements may be appropriately combined with each other.

Recently, electronic components and various control substrates have been used in technically advanced products such as automobiles. Along with technical advancement, a demand for miniaturization of products has increased. Accordingly, the number of electronic components which are integrated per substrate has increased, and there is a demand for a control substrate in which electronic components are highly integrated or which have high capacity. In addition, a high function, a high density, or miniaturization of the electronic components has progressed.

However, a plurality of electronic components is mounted on a control substrate. Examples of the electronic component include an active component, a passive component, a mechanism component, and the like. Typically, among electronic components which are mounted, electricity is supplied to the active component or the passive component, the active component or the passive component has a characteristic of generating heat in many cases. A high function, a high density, or miniaturization of the electronic components has progressed. Accordingly, a total amount of heat generation may increase due to electronic components which are integrated, and heat concentration may occur in a heat distribution of a mounting surface of a control substrate.

In addition, examples of the active component include power transistor such as a power MOSFET and an IGBT which are electronic components generating large heat in operation, and there is a possibility that the heat may deteriorate a function of the electronic component or other electronic components which are mounted at the periphery of the electronic component.

In addition, in a case where the control substrate is a power circuit substrate that supplies large powder for motor drive and the like, high reliability is also required from the viewpoint of securement of stability and the like.

In addition, for example, products such as an automobile are exposed to a harsher environment in which vibration is great and a temperature is high for a long time in comparison to household electrical appliances.

<Electric Power Steering Device>

Figure 1:
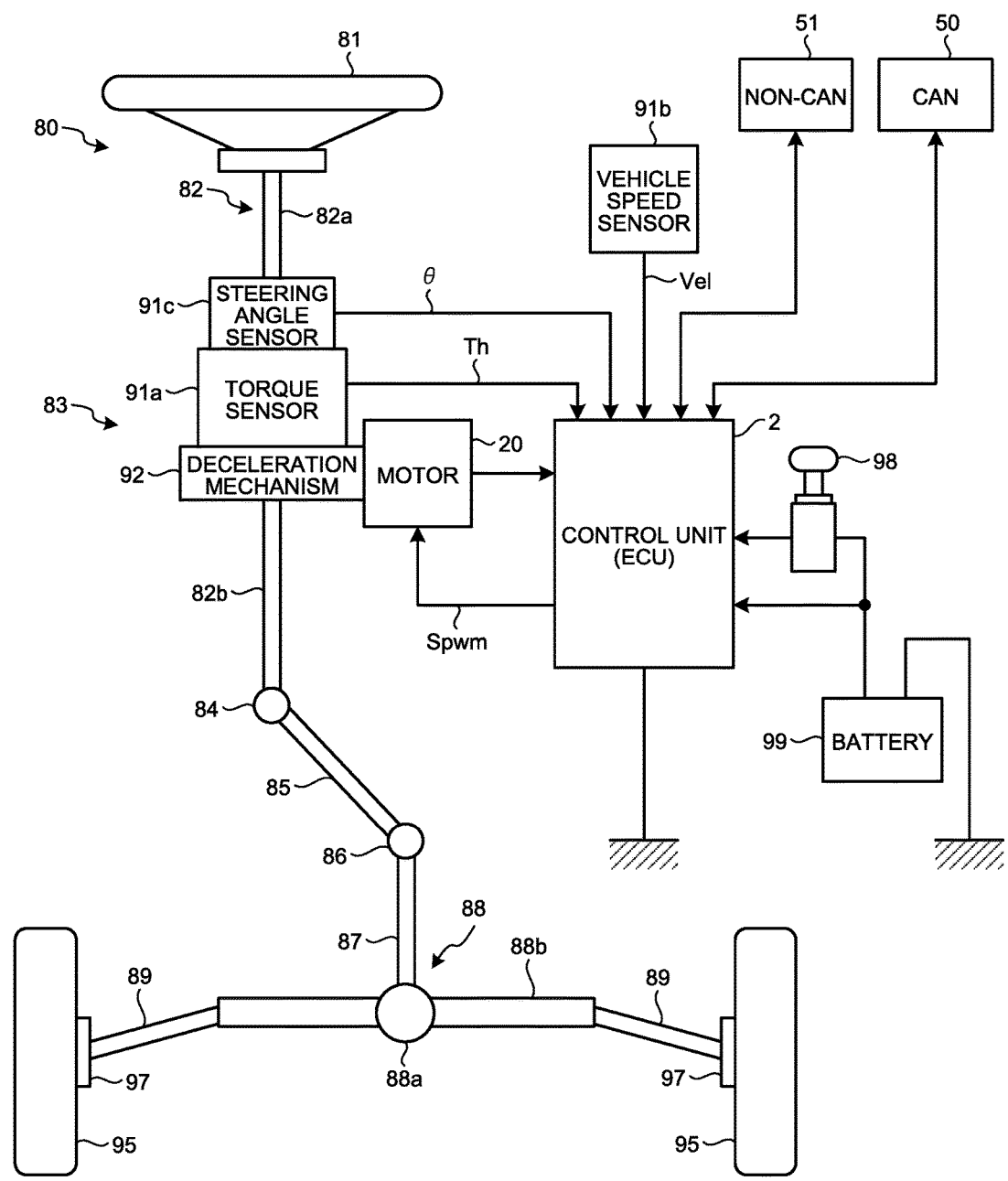
FIG. 1 is a view illustrating a typical configuration of an electric power steering device.

FIG. 1 is a view illustrating a typical configuration of an electric power steering device. The electric power steering device is a device that applies a steering auxiliary force (assist force) to a steering mechanism of a vehicle by using a rotational force of a motor 20. A driving force of the motor 20 is applied to a steering shaft 82 or a rack 88b as the steering auxiliary force through a deceleration mechanism 92.

As illustrated in FIG. 1, an electric power steering device 80 includes a steering wheel 81, a steering shaft 82, a steering force assist mechanism 83, a universal joint 84, a lower shaft 85, a universal joint 86, a pinion shaft 87, a steering gear 88, and a tie rod 89 in a power transmission order given by a steering person.

In addition, the electric power steering device 80 includes a control unit (hereinafter, referred to as electronic control unit (ECU)) 2, a torque sensor 91a, and a steering angle sensor 91c.

The steering shaft 82 includes an input shaft 82a and an output shaft 82b. In the input shaft 82a, one end is connected to the steering wheel 81, and the other end is connected to the steering force assist mechanism 83 through the torque sensor 91a. In the output shaft 82b, one end is connected to the steering force assist mechanism 83, and the other end is connected to the universal joint 84. In this embodiment, the input shaft 82a and the output shaft 82b are formed from a material such as iron.

In the lower shaft 85, one end is connected to the universal joint 84, and the other end is connected to the universal joint 86. In the pinion shaft 87, one end is connected to the universal joint 86, and the other end is connected to the steering gear 88.

The steering gear 88 includes a pinion 88a and the rack 88b. The pinion 88a is connected to the pinion shaft 87. The rack 88b engages with the pinion 88a. The steering gear 88 is configured in a rack and pinion type. The steering gear 88 converts a rotational motion transmitted to the pinion 88a into a linear motion with the rack 88b. The tie rod 89 is connected to the rack 88b.

Driving wheels 95 provided in a vehicle are connected to the tie rod 89 through a hub unit 97.

The steering force assist mechanism 83 includes the deceleration mechanism 92 and the motor 20. Furthermore, the motor 20 may be a so-called brush-less motor or an electric motor including a brush (slider) and a commutator. The deceleration mechanism 92 is connected to the output shaft 82b. The motor 20 is an electric motor that is connected to the deceleration mechanism 92 and generates auxiliary steering torque. Furthermore, in the electric power steering device 80, the steering shaft 82, the torque sensor 91a, and the deceleration mechanism 92 constitute a steering column. The motor 20 supplies the auxiliary steering torque to the output shaft 82b of the steering column. That is, the electric power steering device 80 of this embodiment is a column assist type.

In the column assist type electric power steering device 80, a distance between a steering person and the motor 20 is relatively short, and the motor 20 is disposed in the vicinity of a foot of the steering person in a vehicle interior, and thus there is a possibility that the casing of the ECU 2 amplifies sound that occurs in the vicinity of the motor 20 and the steering person is affected by the amplified sound. Accordingly, in the electric power steering device 80, the sound that occurs in the vicinity of the motor 20 is suppressed to contribute to more comfortable assist operation.

For example, the deceleration mechanism 92 is a worm deceleration device. A rotational force of the motor 20 is transmitted to a worm wheel through a worm inside the deceleration mechanism 92 to rotate the worm wheel. The deceleration mechanism 92 increases torque of the motor 20 with the worm and the worm wheel. In addition, the deceleration mechanism 92 rotates the output shaft 82b and supplies the auxiliary steering torque to the output shaft 82b.

The ECU 2 is electrically connected to the motor 20, the torque sensor 91a, a vehicle speed sensor 91b, and the steering angle sensor 91c.

The torque sensor 91a illustrated in FIG. 1 detects a steering force of the steering person, which is transmitted to the input shaft 82a through the steering wheel 81, as steering torque. Information of steering torque detected by the torque sensor 91a is input to the ECU 2 as a steering torque signal Th.

The vehicle speed sensor 91b is provided in a vehicle, and detects a traveling speed (vehicle speed) of the vehicle on which the electric power steering device 80 is mounted. Vehicle speed information detected by the vehicle speed sensor 91b is input to the ECU 2 as a vehicle speed signal Vel.

The steering angle sensor 91c detects a steering angle of the steering wheel 81. For example, the steering angle sensor 91c detects a rotation angle of the steering wheel 81 from a neutral position of the steering wheel 81 as a steering angle. Information of the steering angle detected by the steering angle sensor 91c is input to the ECU 2 as a steering angle signal θ. Furthermore, the steering angle sensor 91c is not essential, and the steering angle sensor 91c may not be provided in the electric power steering device 80. Alternatively, the ECU 2 may acquire information of the steering angle from a rotation position sensor such as a resolver that is connected to the motor 20 instead of the steering angle sensor 91c.

A controller area network (CAN) 50, through which various pieces of information of a vehicle are transmitted and received, is connected to the ECU 2. Accordingly, the ECU 2 can receive the above-described vehicle speed signal Vel through the CAN 50. In addition, a non-CAN 51, which transmits and receives communication, an analog/digital signal, electric waves, and the like, is also connected to the ECU 2 in addition to the CAN 50.

In addition, with an ignition switch 98 in an on-state, power from a battery 99 is supplied to the ECU 2. The ECU 2 calculates an auxiliary steering command value of an assist command on the basis of the steering torque signal Th, the vehicle speed signal Ve1, and the steering angle signal θ. In addition, the ECU 2 adjusts a motor current Spwm, which is supplied to the motor 20, through a bus bar unit on the basis of the auxiliary steering command value that is calculated.

A steering force of the steering person (driver), which is input to the steering wheel 81, is transmitted to the deceleration mechanism 92 of the steering force assist mechanism 83 through the input shaft 82a. At this time, the ECU 2 acquires information of steering torque input to the input shaft 82a from the torque sensor 91a. In addition, the ECU 2 acquires information of the vehicle speed signal Ve1 from the vehicle speed sensor 91b. In addition, the ECU 2 acquires information of a steering angle from the steering angle sensor 91c. In addition, the ECU 2 calculates a current command value of an assist (steering auxiliary) command on the basis of the steering torque signal Th and the vehicle speed signal Ve1, and supplies the motor current Spwm that is based on the current command value to the motor 20. In this manner, the ECU 2 controls an operation of the motor 20. The auxiliary steering torque obtained by the motor 20 is transmitted to the deceleration mechanism 92.

The steering torque (including auxiliary steering torque) output through the output shaft 82b is transmitted to the lower shaft 85 through the universal joint 84, and is transmitted to the pinion shaft 87 through the universal joint 86. The steering force transmitted to the pinion shaft 87 is transmitted to the tie rod 89 through the steering gear 88 to steer the driving wheel 95.

The ECU 2 performs a feedback control of a motor current. According to this, torque of the steering auxiliary force is generated with accuracy. In the feedback control of the motor current, an electric motor application voltage is adjusted so that a difference between the steering auxiliary command value (current command value) and the electric motor current detection value decreases. Typically, the adjustment of the electric motor application voltage is performed through adjustment of a duty in pulse width modulation (PWM).

Figure 2:
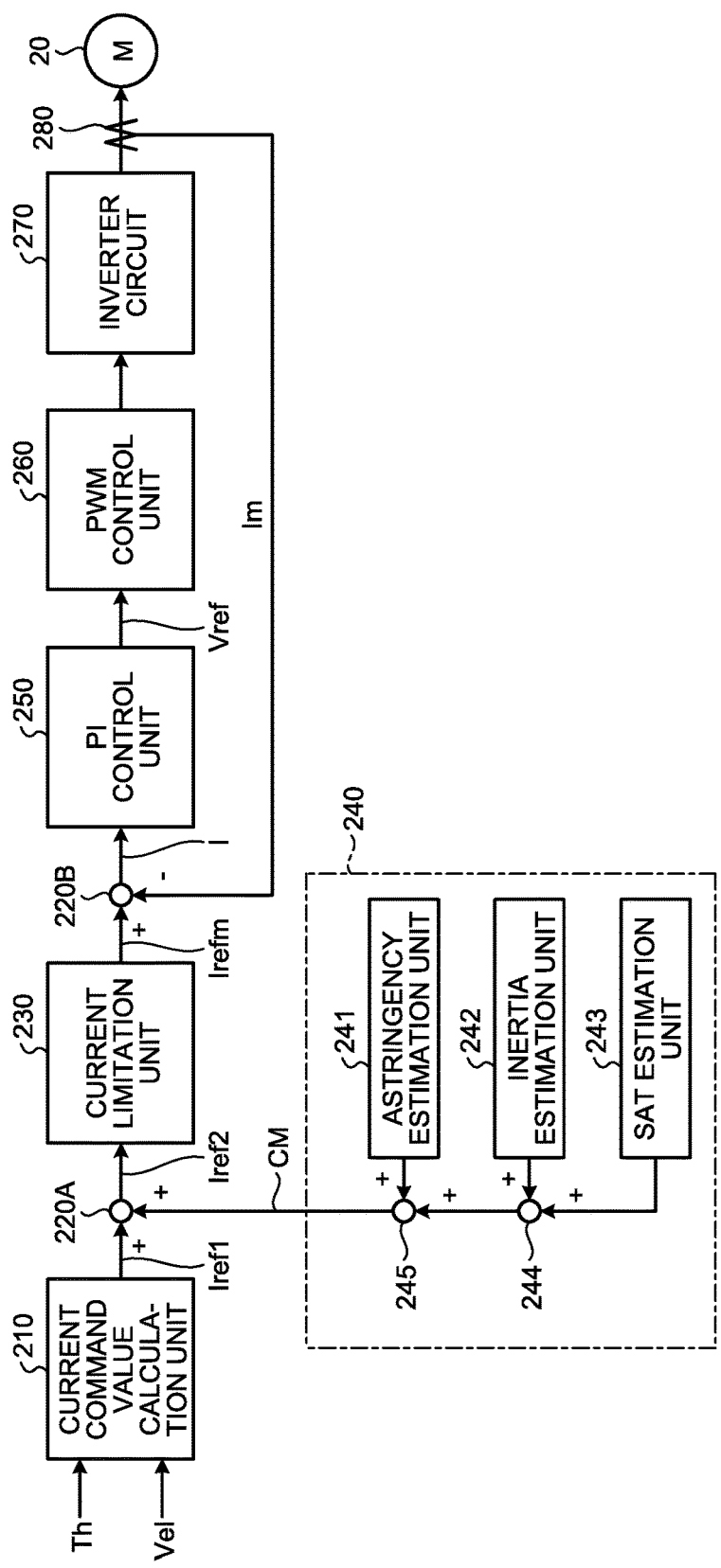
FIG. 2 is a block diagram illustrating a motor control by a control unit in the electric power steering device.

FIG. 2 is a block diagram illustrating a motor control by the control unit in the electric power steering device. The steering torque signal Th and the vehicle speed signal Ve1 are input to a current command value calculation unit 210. The current command value calculation unit 210 calculates a current command value Iref1 that is a control target value of a current that is supplied to the motor 20 with reference to a lookup table (assist map and the like) that is stored in advance on the basis of the steering torque signal Th and the vehicle speed signal Ve1.

A compensation signal generation unit 240 generates a compensation signal CM. The compensation signal generation unit 240 includes an astringency estimation unit 241, an inertia estimation unit 242, and a self-aligning torque (SAT) estimation unit 243. The astringency estimation unit 241 estimates a yaw rate of a vehicle on the basis of an angular velocity of the motor 20, and estimates a compensation value for improving yaw astringency of a vehicle by stopping a whirling operation of the steering wheels 81. The inertia estimation unit 242 estimates an inertia force of the motor 20 on the basis of an angular acceleration of the motor 20, and estimates a compensation value that compensates for the inertia force of the motor 20 to enhance responsiveness. The SAT estimation unit 243 estimates self-aligning torque on the basis of the steering torque signal Th, assist torque, and the angular velocity and the angular acceleration of the motor 20, and estimates a compensation value that compensates for the assist torque by using the self-alignment torque as a reaction force. The compensation signal generation unit 240 may include an estimation unit that estimates another compensation value in addition to the astringency estimation unit 241, the inertia estimation unit 242, and the SAT estimation unit 243. The compensation signal CM is obtained as follows. The compensation value of the inertia estimation unit 242 and the compensation value of the SAT estimation unit 243 are added in an adder 244, and the resultant added value and the compensation value of the astringency estimation unit 241 are added in an adder 245 to obtain the compensation signal CM.

The compensation signal CM from the compensation signal generation unit 240 is added to the current command value Iref1 in an adder 220A, and characteristic compensation of a steering system is made on the current command value Iref1 through the addition of the compensation signal CM, thereby improving astringency, inertia characteristics, and the like. In addition, the current command value Iref1 becomes a characteristic-compensated current command value Iref2 after through the adder 220A, and the current command value Iref2 is input to a current limitation unit 230. In the current limitation unit 230, a maximum current of the current command value Iref2 is limited, and a current command value Irefm is generated. The current command value Irefm is input to a subtractor 220B, and a deviation I (Irefm−Im) between the current command value Irefm and a motor current value Im that is fed back from the motor 20 side is calculated in a subtractor 220B. The deviation I is input to a PI control unit 250 configured to improve characteristics of a steering operation. Then, a voltage control command value Vref of which a characteristic is improved by the PI control unit 250 is input to a PWM control unit 260, and the motor 20 is PWM-driven through an inverter circuit 270 as a motor drive unit. A motor current value Im of the motor 20 is detected by a motor current detector 280, and is fed back to the subtractor 220B. In addition, a field effect transistor (hereinafter, referred to as "FET") is used as a drive element in the inverter circuit 270, and the inverter circuit 270 is constituted by a bridge circuit of FET.

In the electric power steering device 80, in a case where a rank end edge (not illustrated in the drawing) or driving wheels interfere with a curbstone and the like, the motor 20 does not operate. Accordingly, a large current of 100 amperes to 120 amperes flows as the motor current value Im of the motor 20 so that driving with maximum torque is realized by the feedback control, and the FET instantaneously generates heat. It is important for the instantaneous heat generation of the FET to be efficiently transferred to a heat sink to be described later from the viewpoint of preventing breakage of the FET. Accordingly, for example, it is more preferable to satisfy a temperature suppressing effect of a semiconductor die of the FET at an FET drive elapse time of five seconds, and a temperature suppressing effect of the semiconductor die of the FET at an FET drive elapse time of ten seconds for which the motor 20 does not operate and thus drive with the maximum torque may occur by the feedback control.

<Heat Dissipation Substrate>

Hereinafter, a heat dissipation substrate 300 provided inside a casing of the ECU 2 will be described in detail.

Figure 3:
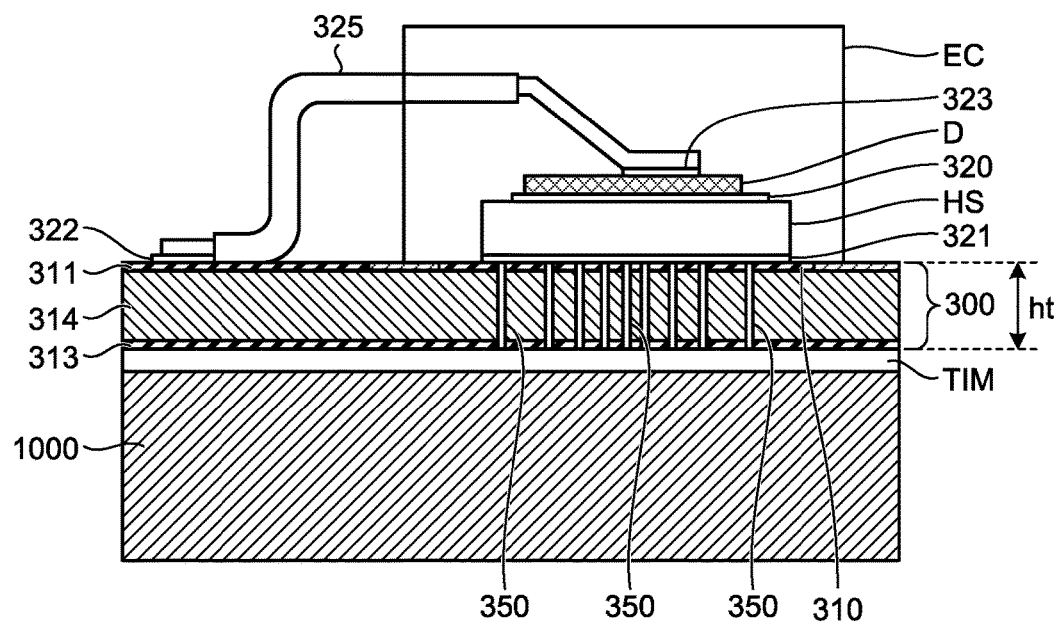
FIG. 3 is a cross-sectional view illustrating a cross-section of a heat dissipation substrate according to this embodiment.
Figure 4:
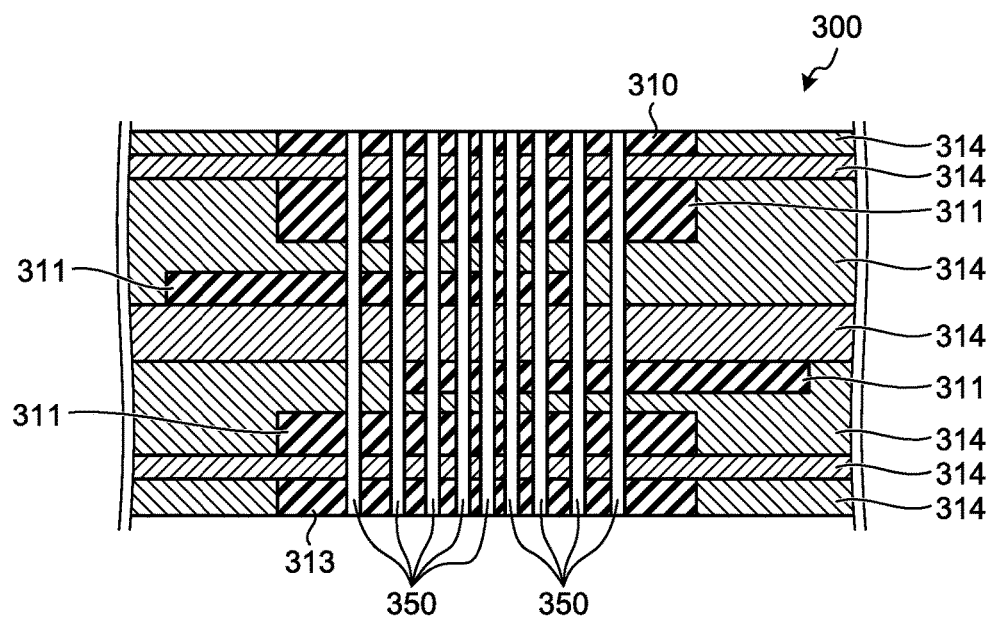
FIG. 4 is a partial cross-sectional view schematically illustrating a cross-sectional structure of the heat dissipation substrate according to this embodiment.
Figure 5:
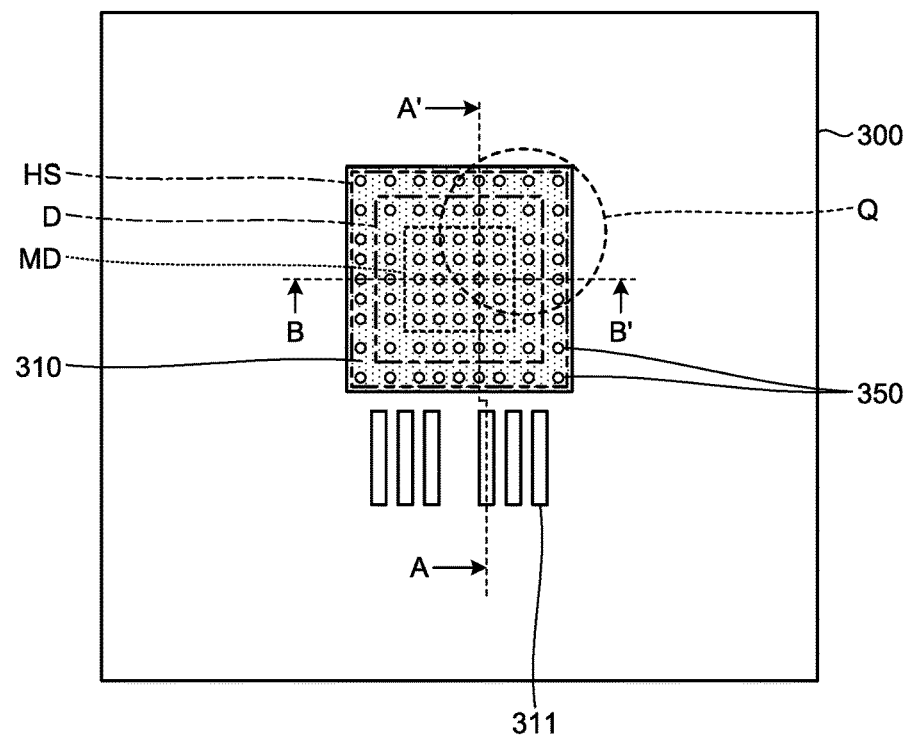
FIG. 5 is a plan view illustrating an arrangement example of a thermal via in the heat dissipation substrate according to this embodiment.
Figure 6:
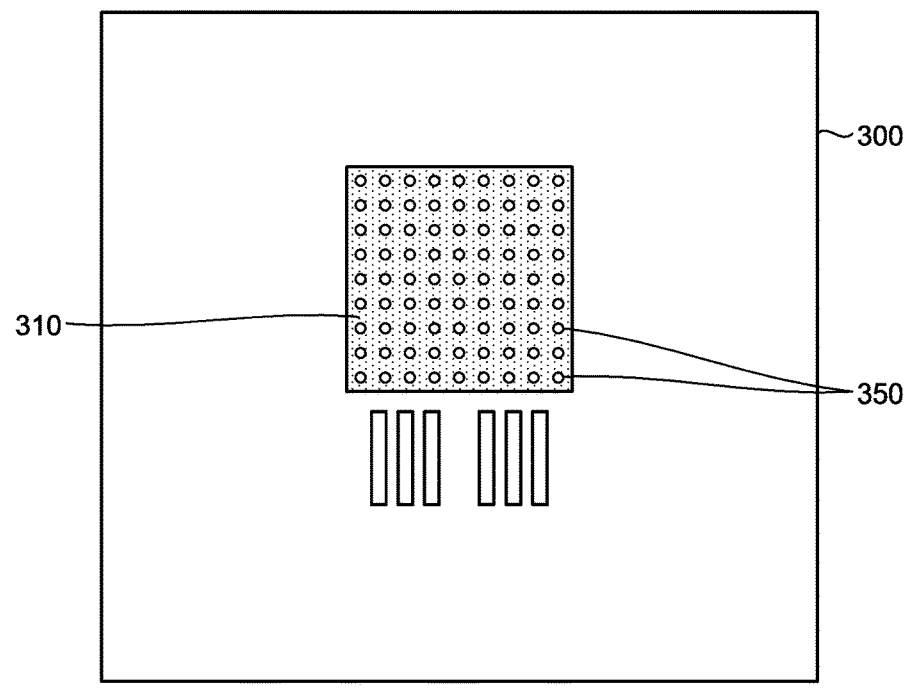
FIG. 6 is a plan view illustrating an arrangement example of a thermal via according to a comparative example.

FIG. 3 is a cross-sectional view illustrating a cross-section of a heat dissipation substrate according to this embodiment. FIG. 4 is a partial cross-sectional view schematically illustrating a cross-sectional structure of the heat dissipation substrate according to this embodiment. FIG. 5 is a plan view illustrating an arrangement example of a thermal via in the heat dissipation substrate according to this embodiment. The cross-section of the heat dissipation substrate in FIG. 3 corresponds to a cross-section taken along line A-A' in FIG. 5. The cross-section of the heat dissipation substrate in FIG. 4 corresponds to a cross-section taken along line B-B' in FIG. 5. FIG. 6 is a plan view illustrating an arrangement example of a thermal via according to a comparative example.

In a heat dissipation substrate 300, an electronic component EC is mounted on a substrate upper surface illustrated in FIG. 3. The substrate upper surface illustrated in FIG. 3 is a mounting surface on which the electronic component EC is mounted. The heat dissipation substrate 300 includes a plurality of thermal vias 350. In this embodiment, the electronic component EC includes a semiconductor die D of the FET, and a heat spreader HS. In this embodiment, the semiconductor die D of the FET is molded with a resin.

An upper surface of the heat spreader HS is joined to a lower surface of the semiconductor die D with a joining metal layer (solder layer) 320 interposed therebetween. A lower surface of the heat spreader HS is joined to a conductor foil 310 with a joining metal layer (solder layer) 321 interposed therebetween. A lead terminal 325 electrically connects the conductor foil 311 on the heat dissipation substrate and the semiconductor die D to each other. In the lead terminal 325, one end is connected to the conductor foil 311 with a joining metal layer (solder layer) 322 interposed therebetween, and the other end is connected to a gate or a source of the semiconductor die D with a joining metal layer (solder layer) 323 interposed therebetween.

As illustrated in FIG. 3, the thermal via 350 includes a metal thin film that is formed by plating and the like on an inner wall of a through-hole, which passes through the heat dissipation substrate 300 between a mounting surface of the heat dissipation substrate 300 and a rear surface that is opposite to the mounting surface.

The thermal via 350 is a heat dissipation structure, and the metal thin film connects between the conductor foil 310 on the mounting surface of the heat dissipation substrate 300, and a conductor foil 313 on the rear surface of the heat dissipation substrate 300.

A thermal interface material (TIM) conducts heat between the conductor foil 313 and a heat sink 1000.

The heat sink 1000 also functions as a casing of the ECU 2, and emits heat to an external space of the ECU2.

As illustrated in FIG. 4, the heat dissipation substrate 300 is a multi-layer substrate in which a plurality of insulating layers 314 is laminated. Each of the insulating layers 314 includes a phenol resin, an epoxy resin, a glass epoxy resin, aluminum oxide, and the like, and has insulating properties. The conductor foil 311 is provided between the insulating layers 314, and the conductor foil 311 is connected to any one of the thermal vias 350.

When being compared with arrangement of the thermal vias 350 in a comparative example illustrated in FIG. 6, as illustrated in FIG. 5, an interval between the thermal vias 350 of this embodiment is set to a non-equal interval. Specifically, a surface density of the thermal via 350 that occupies the mounting surface of the heat dissipation substrate 300 illustrated in FIG. 5 is at least partially different. The surface density of the thermal via 350 per unit area is set to the greatest at a dense portion MD on an inner side in comparison to an edge portion (boundary) of a projection region of the semiconductor die D.

In addition, with regard to the electronic component EC mounted on the heat dissipation substrate 300, a package bottom surface of the electronic component EC is directly disposed on the mounting surface on the substrate. In the electronic component EC, a bare chip of the semiconductor die D may be directly disposed on the mounting surface of the substrate. In addition, the electronic component EC may be mounted in such a manner that the heat spreader HS and the like are interposed between the bare chip of the semiconductor die D and the substrate. In a case of mounting the electronic component EC through the heat spreader HS and the like, the heat spreader HS can be treated while being regarded as a thermal bottom surface side of the electronic component. In this case, as illustrated in FIG. 5, the surface density of the thermal via 350 per unit area becomes the greatest in the dense portion MD on an inner side in comparison to the edge portion (boundary) of the projection region of the heat spreader HS.

Furthermore, insulating properties are required to be secured between the conductor foil 311 that is a wiring pattern portion electrically connected to the electronic component EC, and the conductor foil 310 to which coating (conductor foil) of a metal material such as copper formed on an inner wall of the thermal via 350 and on a peripheral edge of an opening is electrically connected.

A shape (opening shape) of the thermal via 350 in a plan view is not particularly limited, and may be, for example, a quadrangle without limitation to a circle illustrated in FIG. 5. The thermal via 350 is a through-hole that passes through the heat dissipation substrate 300 between the mounting surface of the heat dissipation substrate 300 and a rear surface that is opposite to the mounting surface, and the thickness of the substrate illustrated in FIG. 3 becomes a height ht of the thermal via 350. In a case where the shape (opening shape) of the thermal via 350 in a plan view is a circle, the shape (opening shape) of the thermal via 350 in a plan view and an inner diameter of the thermal via 350 at the inner wall are the same as each other. In addition, the inner diameter of the thermal via 350 is equal to or less than the thickness of the heat dissipation substrate 300.

In correspondence with a heat generation distribution on a bottom surface side of the electronic component EC, in a region in which the amount of heat generation of the bottom surface of the electronic component EC is large, the number of the thermal via 350 disposed per unit area is set to be large, and in a region in which the amount of heat generation of the bottom surface of the electronic component EC is small, the number of the thermal via 350 disposed per unit area is set to be small. In a case where the shape (opening shape) of the thermal via 350 in a plan view is the same in each case, the larger the number of the thermal via 350 per unit area is, the greater the surface density of the thermal via 350 becomes.

In addition, typically, the heat generation distribution on the bottom surface side of the electronic component EC may conform to the geometric shape of the bottom surface of the electronic component EC in many cases. In this case, there is a tendency that the amount of heat generation is great at the geometrical center G0 on the bottom surface side of the electronic component EC.

Accordingly, in a case where the bottom surface side of the electronic component EC has a circular shape, a region in the vicinity of the center of the circle may be the heat generation center. In addition, the bottom surface side has a rectangular shape, a region in the vicinity of an intersection of diagonal lines of a rectangle may become the heat generation center in many cases. Here, in this embodiment, the dense portion MD of the thermal via 350 is located to overlap the geometrical center G0 in a plan view.

Figure 7:
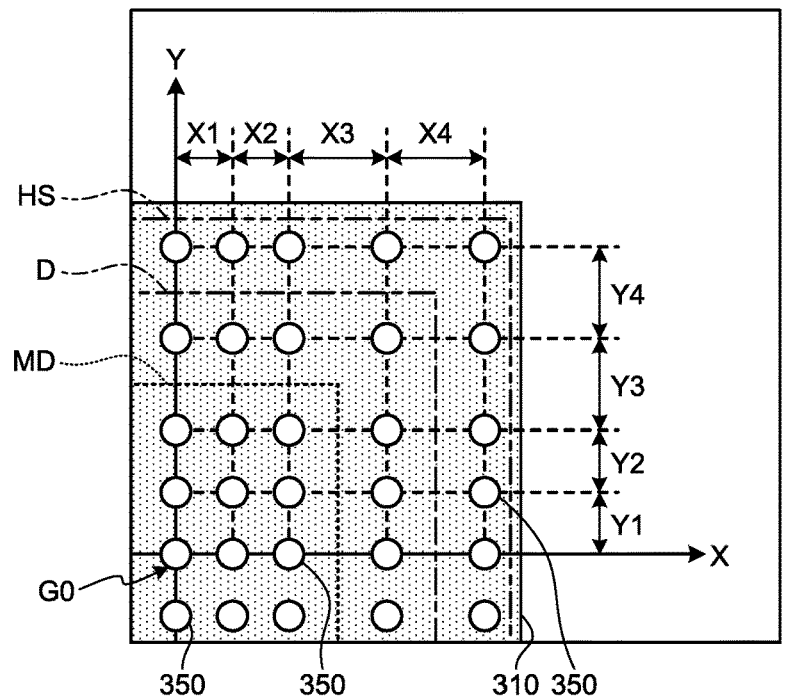
FIG. 7 is a plan view illustrating an arrangement example of the thermal via in the heat dissipation substrate according to this embodiment.

FIG. 7 is a plan view illustrating an arrangement example of the thermal via in the heat dissipation substrate according to this embodiment. FIG. 7 is an enlarged plan view in which a part Q in FIG. 5 is enlarged. In FIG. 7, an intersection of diagonal lines of the semiconductor die D and an intersection of diagonal lines of the heat spreader HS match each other at the geometrical center G0. In FIG. 7, when a coordinate axis X in a first direction that passes through the geometrical center G0, and a coordinate axis Y in a second direction that passes through the geometrical center G0 and is perpendicular to the coordinate axis X in the first direction are set as a reference, the number of the thermal vias 350 disposed in a matrix shape in the first direction and the second direction is the same in each direction. A plurality of the thermal vias 350 is disposed along the coordinate axis X in the first direction at intervals of X1, X2, X3, and X4 from a side close to the geometrical center G0. In addition, a plurality of the thermal vias 350 is disposed along the coordinate axis Y in the second direction at intervals Y1, Y2, Y3, and Y4 from a side close to the geometrical center G0. In this embodiment, the intervals X1 and X2 of the thermal vias 350, which are disposed on an inner side of a projection region of the semiconductor die D and are adjacent to each other, are smaller than the interval X3 of the thermal vias 350 which are disposed on an outer side in the projection region of the semiconductor die D and are adjacent to each other. Similarly, the intervals Y1 and Y2 of the thermal vias 350, which are disposed on an inner side in the projection region in the semiconductor die D and are adjacent to each other, are smaller than the interval Y3 of the thermal vias 350 which are disposed on an outer side in the projection region of the semiconductor die D and are adjacent to each other.

In this embodiment, the intervals X1 and X2 of the thermal vias 350, which are disposed on an inner side in the projection region of the semiconductor die D and are adjacent to each other, are smaller than the interval X4 of the thermal vias 350 which are disposed on an outer side in the projection region of the heat spreader HS and are adjacent to each other. Similarly, the intervals Y1 and Y2 of the thermal vias 350, which are disposed on an inner side in the projection region of the heat spreader HS and are adjacent to each other, are smaller than the interval Y4 of the thermal vias 350 which are disposed on an outer side in the projection region of the semiconductor die D and are adjacent to each other.

Due to the arrangement of the thermal vias 350 described above, the dense portion MD overlaps the geometrical center G0 of the projection region of the semiconductor die D or the heat spreader HS in a plan view, and at a portion that is further spaced away from the geometrical center G0 in comparison to the dense portion MD, the surface density of the thermal vias 350 becomes smaller than the surface density in the dense portion MD.

According to the arrangement of the thermal vias 350, heat of the mounting surface is conducted in a substrate thickness direction, and thus can be conducted to the outside of the substrate in an efficient manner and at the low cost. In addition, even in a case where a heat distribution of the mounting surface is temporally different, when a temperature of the mounting surface is low, heat of the mounting surface is conducted in the substrate thickness direction by the thermal vias 350 in the dense portion MD. In addition, when the temperature of the mounting surface is high, heat of the mounting surface is conducted in the substrate thickness direction by the thermal vias 350 which exist at the periphery of the dense portion MD, and the amount of heat received from the mounting surface at a time increases. As a result, an effect of suppressing a die temperature of the semiconductor die D and a copper foil temperature of the conductor foil 310 is high. In the electric power steering device 80, in a case of mounting the heat dissipation substrate 300 on the ECU2, it is possible to suppress the temperature of the semiconductor die D of the FET at the FET drive elapse time of five seconds due to the thermal vias 350 in the dense portion MD, and it is possible to suppress the temperature of the semiconductor die D of the FET at the FET drive elapse time of ten seconds due to the thermal vias 350 at the periphery of the dense portion MD.

Figure 8:
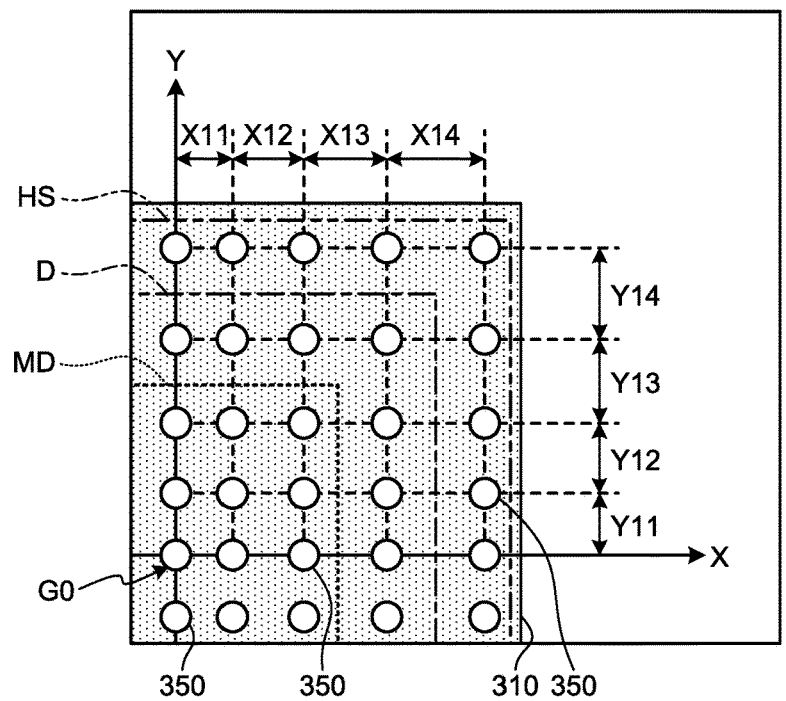
FIG. 8 is a plan view illustrating an arrangement example of a thermal via in a heat dissipation substrate according to a first modification example of this embodiment.

FIG. 8 is a plan view illustrating an arrangement example of a thermal via in a heat dissipation substrate according to a first modification example of this embodiment. The same reference numeral will be given the same constituent element as described above, and description thereof will be omitted. As illustrated in FIG. 8, a plurality of the thermal vias 350 is disposed along the coordinate axis X in the first direction at intervals of X11, X12, X13, and X14 from a side close to the geometrical center G0. In addition, a plurality of the thermal vias 350 is disposed along the coordinate axis Y in the second direction at intervals Y11, Y12, Y13, and Y14 from a side close to the geometrical center G0.

Intervals between the thermal vias 350 adjacent to each other satisfy a relationship of X11<X12<X13<X14, and a relationship of Y11<Y12<Y13<Y14. That is, the interval between the thermal vias 350 adjacent to each other becomes gradually wider from an inner side toward an outer side in the projection region of the semiconductor die D. Similarly, the interval between the thermal vias 350 adjacent to each other becomes gradually wider from an inner side toward an outer side in the projection region of the heat spreader HS.

According to the arrangement of the thermal vias 350, heat of the mounting surface is conducted in the substrate thickness direction, and it is possible to conduct the heat to the outside of the substrate in an efficient manner and at the low cost. In addition, even in a case where a heat distribution of the mounting surface is temporally different, when a temperature of the mounting surface is low, heat of the mounting surface is conducted in the substrate thickness direction by the thermal vias 350 in the dense portion MD. In addition, when the temperature of the mounting surface is high, heat of the mounting surface is conducted in the substrate thickness direction by the thermal vias 350 of which an interval becomes wider as it is spaced away from the dense portion MD, and the amount of heat received from the mounting surface at a time increases. As a result, an effect of suppressing a die temperature of the semiconductor die D and a copper foil temperature of the conductor foil 310 is high. In the electric power steering device 80, in a case of mounting the heat dissipation substrate 300 on the ECU2, it is possible to suppress the temperature of the semiconductor die D of the FET at the FET drive elapse time of five seconds due to the thermal vias 350 in the dense portion MD, and it is possible to suppress the temperature of the semiconductor die D of the FET at the FET drive elapse time of ten seconds due to the thermal vias 350 which exist at the periphery of the dense portion MD.

Figure 9:
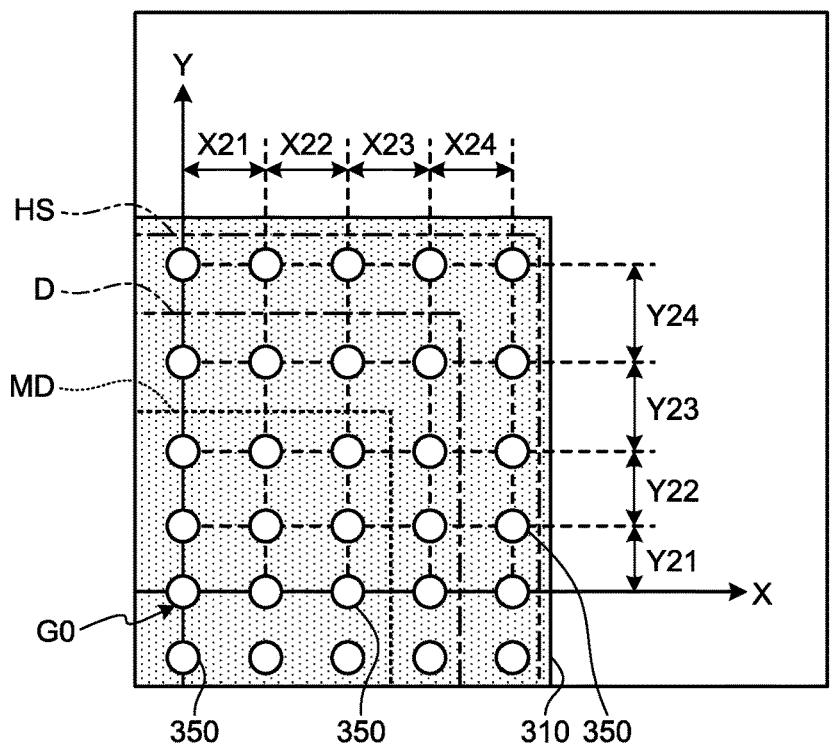
FIG. 9 is a plan view illustrating an arrangement example of a thermal via in a heat dissipation substrate according to a second modification example of this embodiment.

FIG. 9 is a plan view illustrating an arrangement example of a thermal via in a heat dissipation substrate according to a second modification example of this embodiment. The same reference numeral will be given to the same constituent element as described above, and description thereof will be omitted. As illustrated in FIG. 9, a plurality of the thermal vias 350 is disposed along the coordinate axis X in the first direction at intervals of X21, X22, X23, and X24 from a side close to the geometrical center G0. In addition, a plurality of the thermal vias 350 is disposed along the coordinate axis Y in the second direction at intervals Y21, Y22, Y23, and Y24 from a side close to the geometrical center G0.

Intervals between the thermal vias 350 adjacent to each other satisfy a relationship of X21=X22=X23=X24, and a relationship of Y21<Y22<Y23<Y24. That is, the interval between the thermal vias 350 adjacent to each other along the coordinate axis X in the first direction is the same in each case. The interval between the thermal vias 350 adjacent to each other along the coordinate axis Y in the second direction becomes gradually wider. As described above, in the second modification example of this embodiment, the intervals X21, X22, X23, and X24 between the thermal vias 350 adjacent to each other in the first direction from an inner side to an outer side in the projection region of the semiconductor die D are the same as each other, and intervals of the thermal vias 350 adjacent to each other in the second direction from the inner side to the outer side in the projection region of the semiconductor die D become gradually wider in the order of intervals Y21, Y22, Y23, and Y24.

According to the arrangement of the thermal vias 350, heat of the mounting surface is conducted in the substrate thickness direction, and it is possible to conduct the heat to the outside of the substrate in an efficient manner and at the low cost. In addition, even in a case where a heat distribution of the mounting surface is temporally different, when a temperature of the mounting surface is low, heat of the mounting surface is conducted in the substrate thickness direction by the thermal vias 350 in the dense portion MD. In addition, when the temperature of the mounting surface is high, heat of the mounting surface is conducted in the substrate thickness direction by the thermal vias 350 of which an interval becomes wider as it is spaced away from the dense portion MD in the second direction from the inner side to the outer side in the projection region of the semiconductor die D, and the amount of heat received from the mounting surface at a time increases. As a result, an effect of suppressing a die temperature of the semiconductor die D and a copper foil temperature of the conductor foil 310 is high. In the electric power steering device 80, in a case of mounting the heat dissipation substrate 300 on the ECU2, it is possible to suppress the temperature of the semiconductor die D of the FET at the FET drive elapse time of five seconds due to the thermal vias 350 in the dense portion MD, and it is possible to suppress the temperature of the semiconductor die D of the FET at the FET drive elapse time of ten seconds due to the thermal vias 350 which exist at the periphery of the dense portion MD.

Figure 10:
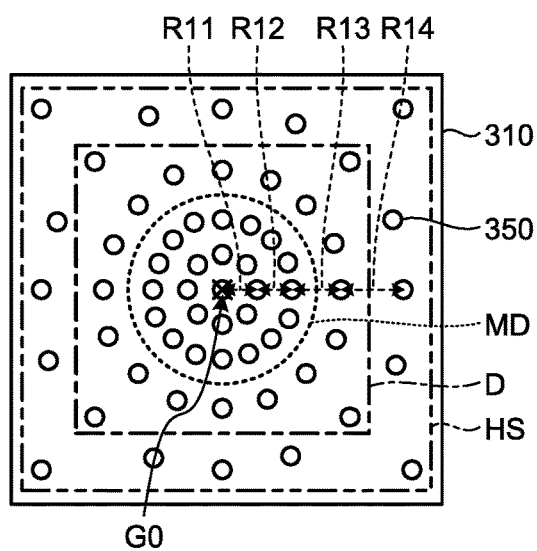
FIG. 10 is a plan view illustrating an arrangement example of a thermal via in a heat dissipation substrate according to a third modification example of this embodiment.

FIG. 10 is a plan view illustrating an arrangement example of a thermal via in a heat dissipation substrate according to a third modification example of this embodiment. The same reference numeral will be given the same constituent element as described above, and description thereof will be omitted. As illustrated in FIG. 10, a plurality of thermal vias 350 is arranged in a concentric circular shape so that a surface density becomes dense on a side close to the geometrical center G0. The plurality of thermal vias 350 is arranged at intervals R11, R12, R13, and R14 in a direction to be spaced away from the geometrical center G0. As illustrated in FIG. 10, the intervals of the thermal vias 350 adjacent to each other satisfy a relationship of R11<R12<R13<R14.

Accordingly, an interval between the thermal vias 350 adjacent to each other becomes gradually wider from an inner side to an outer side in the projection region of the semiconductor die D. Similarly, an interval between the thermal vias 350 adjacent to each other becomes gradually wider from an inner side to an outer side in the projection region of the heat spreader HS. According to this, the dense portion MD overlaps the geometrical center G0 of the projection region of the semiconductor die D or the heat spreader HS in a plan view, and the further a location is spaced away from the geometrical center G0, the smaller the surface density of the thermal vias 350 becomes.

The surface density of the plurality of thermal vias 350 may gradually decrease in two steps or in several steps from the inner side to the outer side of the projection region of the semiconductor die D or the heat spreader HS.

When a heat distribution of the mounting surface of the electronic component EC is known in advance, the dense portion MD may be set to overlap the heat generation center of the heat distribution in a plan view in correspondence with the heat generation center of the heat distribution.

Figure 11:
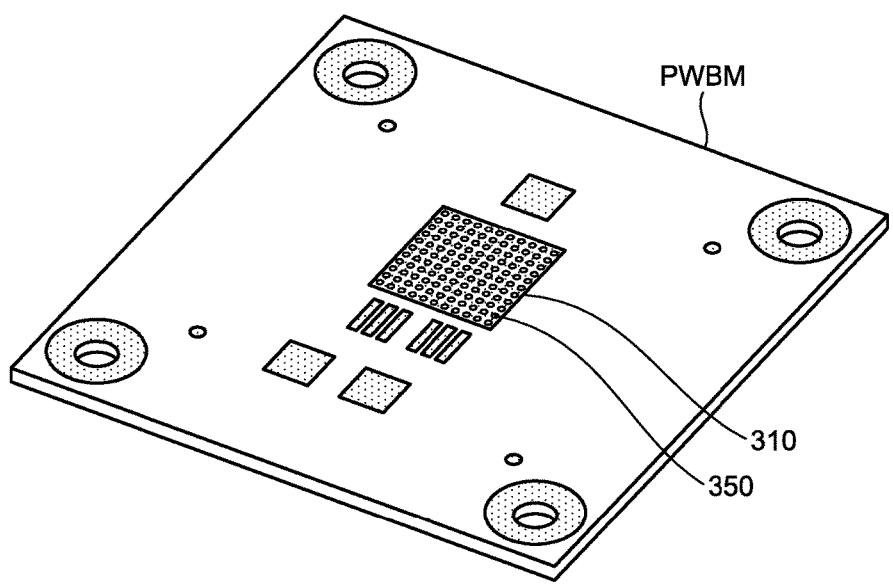
FIG. 11 is a perspective view of an evaluation substrate that is an evaluation test model of an evaluation example.

(Evaluation Test Model of Evaluation Example) FIG. 11 is a perspective view of an evaluation substrate that is an evaluation test model of an evaluation example. An evaluation substrate PWBM illustrated in FIG. 11 is a substrate that is used in a simulation evaluation of the heat dissipation substrate in this embodiment. A plate thickness of the evaluation substrate PWBM is 1.41 mm, and an external size is 50 mm×50 mm.

As illustrated in FIG. 11, the conductor foil 310 constituted by a copper foil film on which the electronic component EC is mounted is provided on the mounting surface of the evaluation substrate PWBM, and the plurality of thermal vias 350 is provided in the conductor foil 310. In addition, similarly to FIG. 3, the heat sink 1000 having a thickness of 10 mm is provided on a rear surface of the evaluation substrate PWBM through a TIM, and heat dissipation from the heat sink 1000 is performed.

In the evaluation substrate PWBM, an area of the conductor foil 310 is approximately 100 mm$^2$, and a diameter of a shape (opening shape) of each of the thermal vias 350 in a plan view is 0.5 mm. Evaluation based on simulations of Evaluation 1, Evaluation 2, and Evaluation 3 described below is performed on the basis of the above-described evaluation test model, and various pieces of data are described.

Evaluation 1

As Evaluation 1, a temperature of the conductor foil 310 and a die temperature of the semiconductor die D are simulated with respect to cases where the number of thermal vias 350 is 16, 36, 64, 81, or 121 under a condition in which an interval between the thermal vias 350 adjacent to each other is the same in each case.

Figure 12:
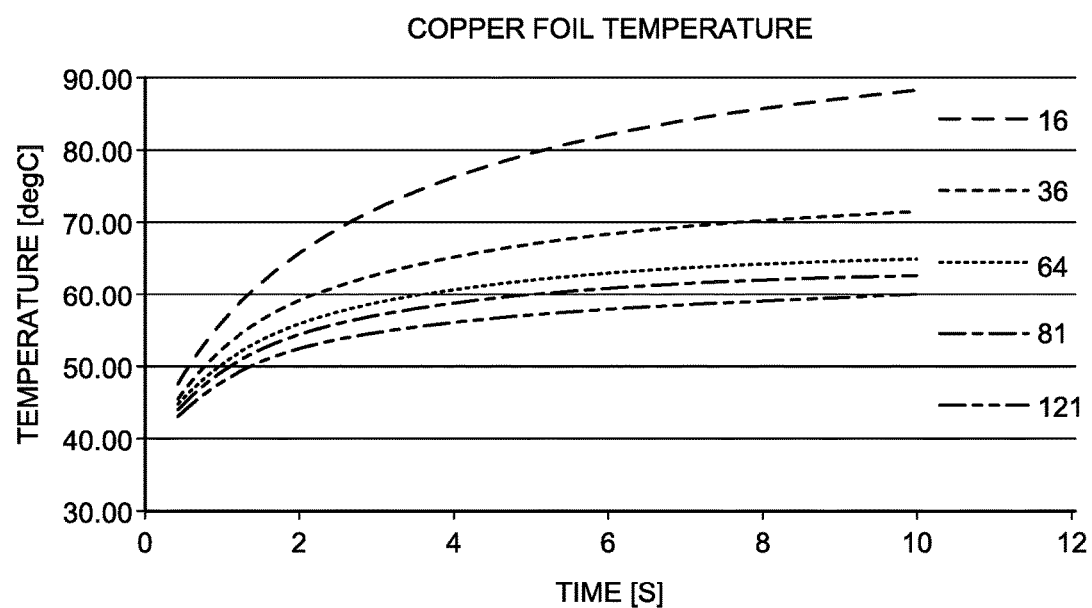
FIG. 12 is a graph illustrating a relationship between time and a copper foil temperature in a case where only a predetermined number of thermal vias are disposed in conductor foil in Evaluation 1.
Figure 13:
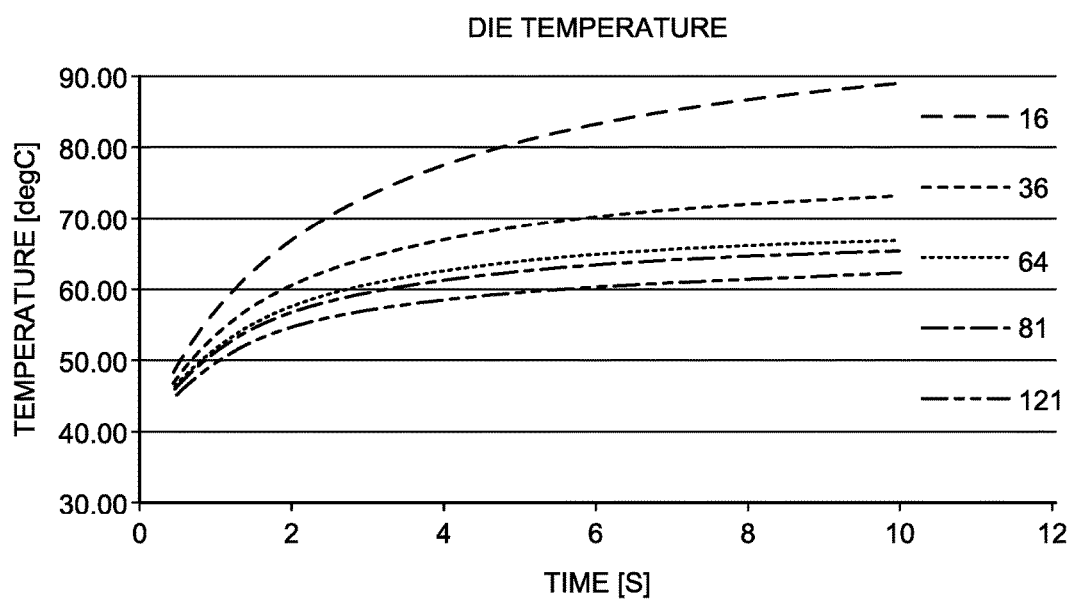
FIG. 13 is a graph illustrating a relationship between time and a die temperature as illustrated in FIG. 12 in Evaluation 1.

FIG. 12 is a graph illustrating a relationship between time and the copper foil temperature in a case where only a predetermined number of thermal vias are disposed in conductor foil in Evaluation 1. FIG. 13 is a graph illustrating a relationship between time and the die temperature as illustrated in FIG. 12 in Evaluation 1. In FIG. 12, the horizontal axis represents time, and the vertical axis represents the temperature of the conductor foil 310. In FIG. 13, the horizontal axis represents time, and the vertical axis represents the temperature of the semiconductor die D. Furthermore, in FIG. 12 and FIG. 13, digit strings in the drawings represent the number of the thermal vias.

Figure 14:
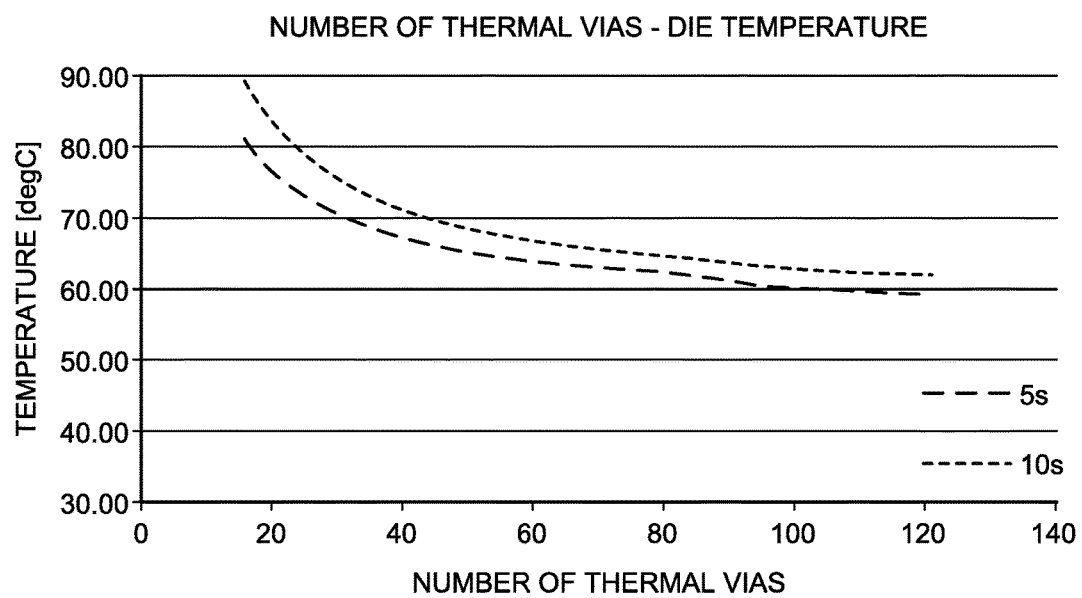
FIG. 14 is a graph illustrating a relationship between the number of the thermal vias and the die temperature at an FET drive elapse time of five seconds and ten seconds in Evaluation 1.

FIG. 14 is a graph illustrating a relationship between the number of the thermal vias and the die temperature at the FET drive elapse time of five seconds and ten seconds in Evaluation 1. In addition, in FIG. 14, the horizontal axis represents the number of the thermal vias, the vertical axis represents the temperature of the semiconductor die D, and digit strings on a right side represent time elapse (s: second).

As illustrated in FIG. 12 and FIG. 13, the further the number of the thermal vias increases, the further an effect of suppressing a temperature rise of the conductor foil 310 or the semiconductor die D is enhanced. As illustrated in FIG. 14, when the number of the thermal vias 350 is 30 or greater, the die temperature rise of the semiconductor die D is further effectively suppressed. When the number of the thermal vias is 36 or greater, a difference between a temperature at the FET drive elapse time of five seconds and a temperature at the FET drive elapse time of ten seconds becomes small. Preferably, when the number of the thermal vias is 40 or greater, the difference between the temperature at the FET drive elapse time of five seconds and the temperature at the FET drive elapse time of ten seconds becomes small. In a case where the number of the thermal vias is 40 or greater, a variation in the difference between the temperature at the FET drive elapse time of five seconds and the temperature at the FET drive elapse time of ten seconds becomes small when the number of the thermal vias is 40 or greater, and a difference in the effect of suppressing the temperature of the semiconductor die D is also small.

When the number of the thermal vias 350 increases, the copper foil on an inner wall of the thermal vias 350 increases, and thus the copper foil increased area (that is, an area of the conductor foil contributing to thermal conduction) is enlarged. Here, with regard to the copper foil increased area, in correspondence with the number of the thermal vias 350, an increase in an inner wall area of the thermal vias 350 is set as an increment of the copper foil area, and a decrease in an area of the conductor foil 310 on the mounting surface and a decrease in an area of the conductor foil 313 on the rear surface due to the thermal vias 350 are set as a decrement of the copper foil area. Accordingly, when a radius of the thermal vias is set to r, a height of the thermal vias is set to ht, and the number of the thermal vias is set to n, the copper foil increased area S can be calculated by the following Expression (1).

$$S = (2\pi r \times ht - 2 \times \pi r^2) \times n \quad (1)$$

Figure 15:
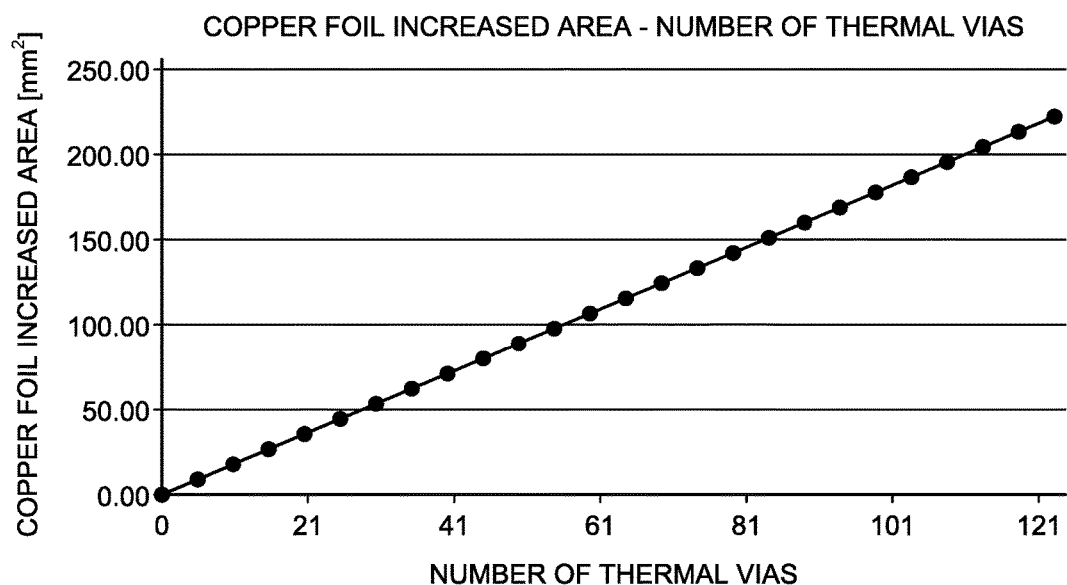
FIG. 15 is a graph illustrating a relationship between the number of the thermal vias, and an estimated value of the copper foil increased area in Evaluation 1.

FIG. 15 is a graph illustrating a relationship between the number of the thermal vias, and an estimated value of the copper foil increased area in Evaluation 1. As illustrated in FIG. 15, when the height ht of the thermal vias is 1.41 mm, the radius r of the thermal vias is 0.25 mm, and the number n of the thermal vias is 36, the copper foil increased area S becomes 65.6 mm$^2$ in accordance with Expression (1). Similarly, when the number n of the thermal vias is 30, the copper foil increased area S becomes 54.6 mm$^2$ in accordance with Expression (1). When the number n of the thermal vias is 40, the copper foil increased area S becomes 72.8 mm$^2$ in accordance with Expression (1).

As described above, with respect to an area of 100 mm$^2$ of the conductor foil 310 that is located at a position at which the bottom surface portion of the electronic component EC is at least projected, when the copper foil increased area S is 50 mm$^2$ or greater, the die temperature rise of the semiconductor die D is suppressed, and the difference between the temperature at the FET drive elapse time of five seconds and the temperature at the FET drive elapse time of ten seconds becomes small. With respect to the area of 100 mm$^2$ of the conductor foil 310 that is located at a position at which the bottom surface portion of the electronic component EC is at least projected, when the copper foil increased area S is 65 mm$^2$ or greater, the die temperature rise of the semiconductor die D is suppressed.

Evaluation 2

Figure 16:
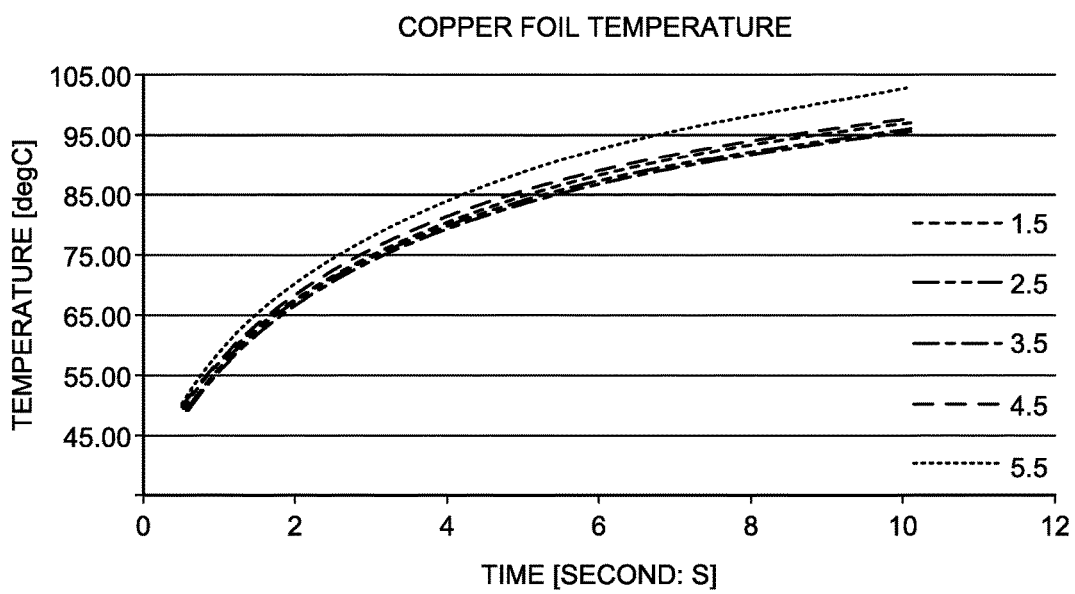
FIG. 16 is a graph illustrating a temporal variation of a copper foil temperature in Evaluation 2.
Figure 17:
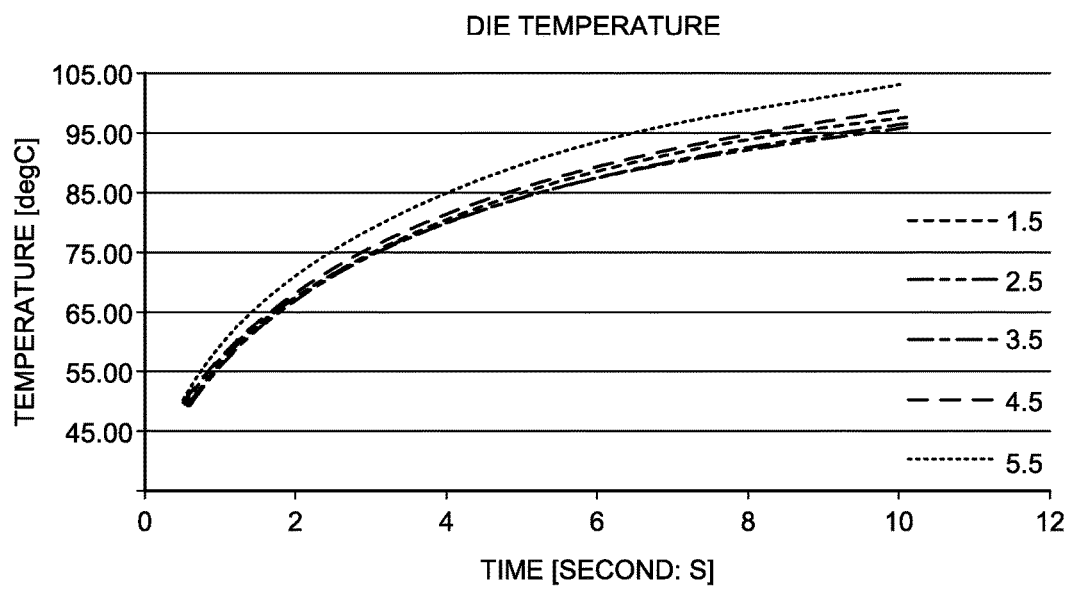
FIG. 17 is a graph illustrating a temporal variation of a die temperature in Evaluation 2.
Figure 18:
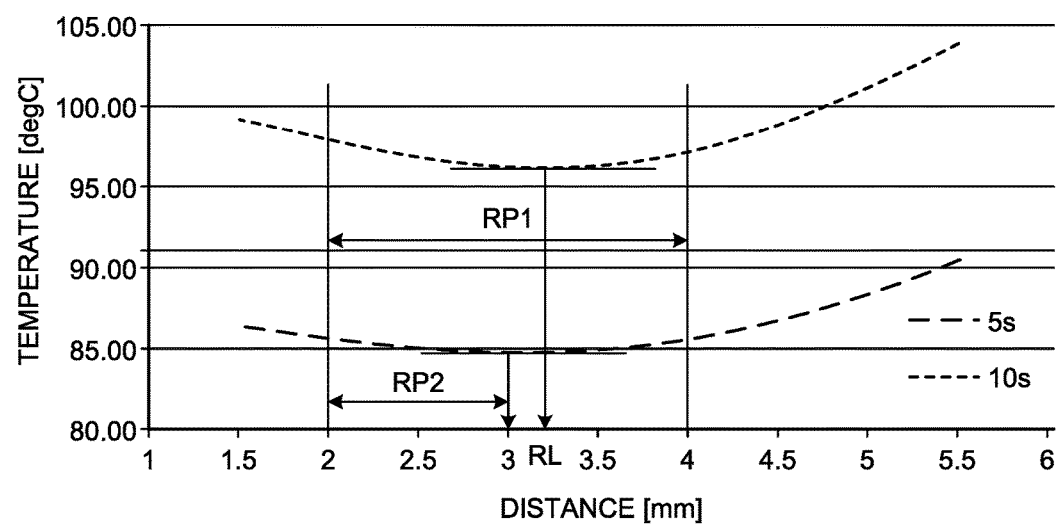
FIG. 18 is a graph illustrating a relationship between a distance of the thermal vias and the die temperature at the FET drive elapse time of five seconds and ten seconds in Evaluation 2.
Figure 19:
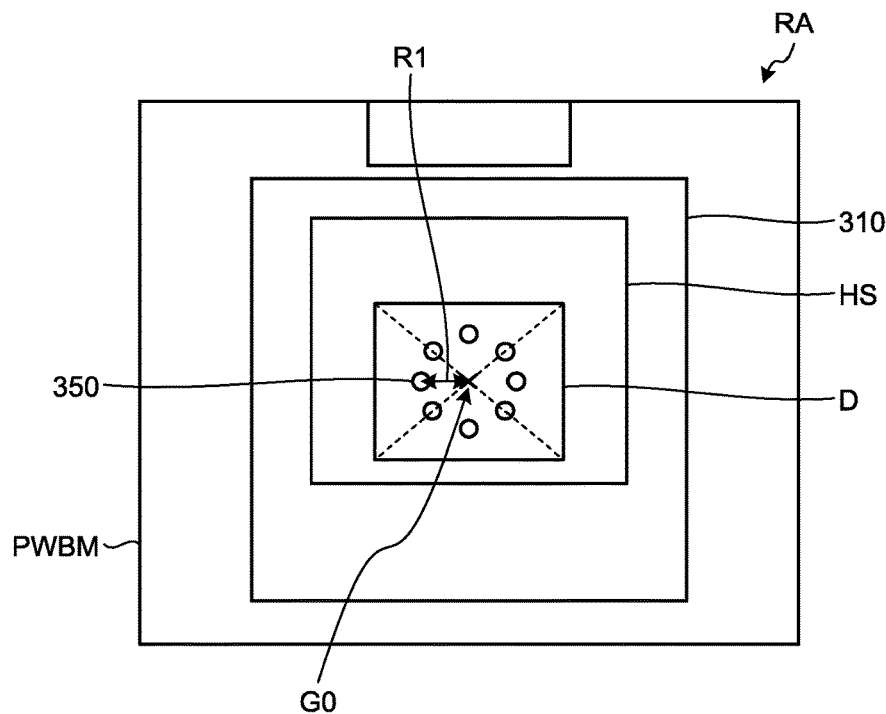
FIG. 19 is a plan view illustrating arrangement of the thermal vias in Evaluation Example RA.
Figure 20:
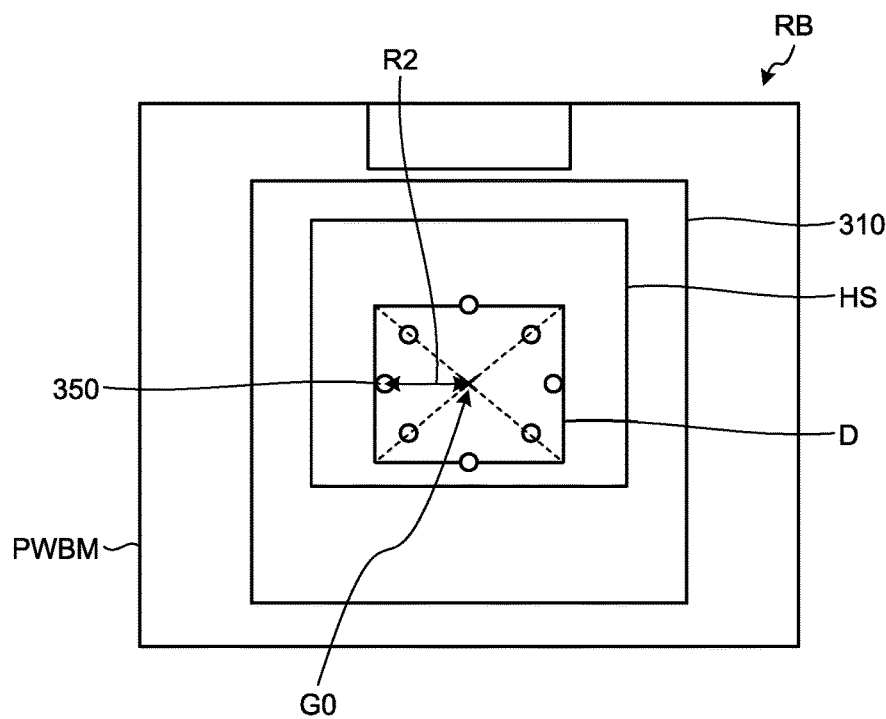
FIG. 20 is a plan view illustrating arrangement of the thermal vias in Evaluation Example RB.
Figure 21:
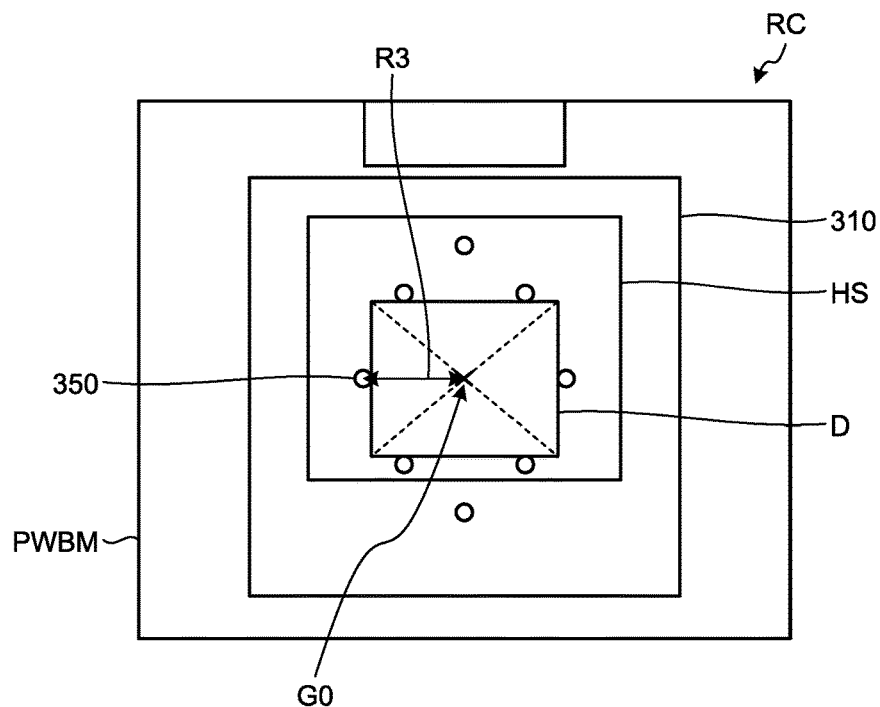
FIG. 21 is a plan view illustrating arrangement of the thermal vias in Evaluation Example RC.
Figure 22:
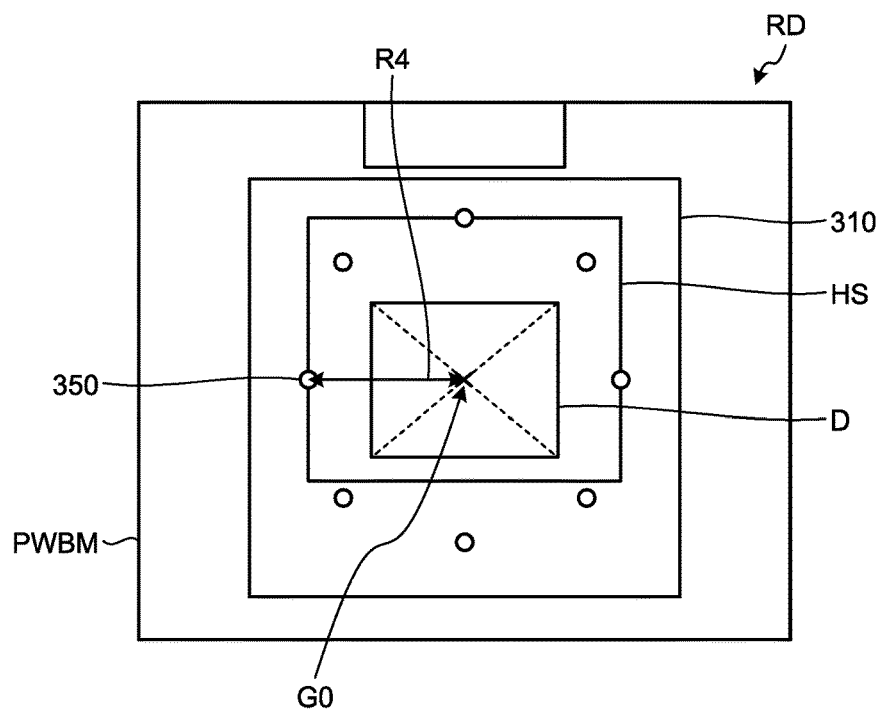
FIG. 22 is a plan view illustrating arrangement of the thermal vias in Evaluation Example RD.
Figure 23:
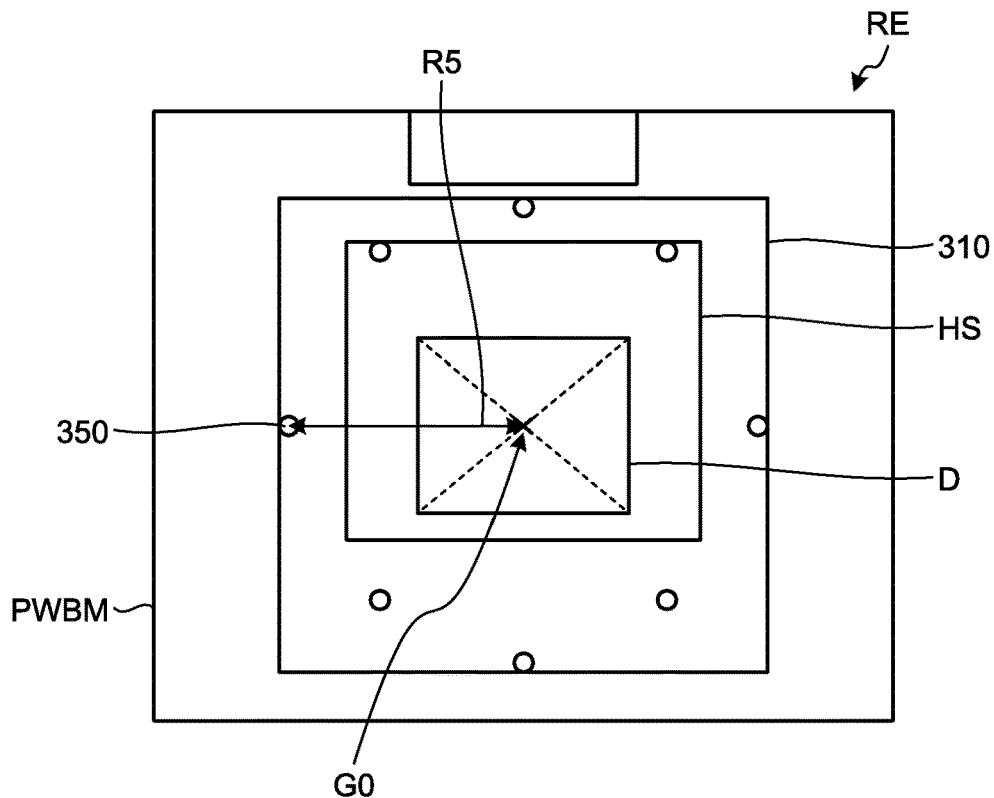
FIG. 23 is a plan view illustrating arrangement of the thermal vias in Evaluation Example RE.

FIG. 16 is a graph illustrating a temporal variation of a copper foil temperature in Evaluation 2. FIG. 17 is a graph illustrating a temporal variation of a die temperature in Evaluation 2. FIG. 18 is a graph illustrating a relationship between a distance of the thermal vias and the die temperature at the FET drive elapse time of five seconds and ten seconds in Evaluation 2. FIG. 19 is a plan view illustrating arrangement of the thermal vias in Evaluation Example RA. FIG. 20 is a plan view illustrating arrangement of the thermal vias in Evaluation Example RB. FIG. 21 is a plan view illustrating arrangement of the thermal vias in Evaluation Example RC. FIG. 22 is a plan view illustrating arrangement of the thermal vias in Evaluation Example RD. FIG. 23 is a plan view illustrating arrangement of the thermal vias in Evaluation Example RE. As Evaluation 2, with respect to respective cases of Evaluation Example RA, Evaluation Example RB, Evaluation Example RC, Evaluation Example RD, and Evaluation Example RE in which the number of the thermal vias 350 is 8, and which are different in a distance from the geometrical center G0 of the projection region of the semiconductor die D, the temperature of the conductor foil 310 and the die temperature of the semiconductor die D are simulated. FIG. 16, FIG. 17, and FIG. 18 illustrate evaluation results in Evaluation 2.

A distance R1 from the geometrical center G0 of the projection region of the semiconductor die D in Evaluation Example RA is 1.5 mm. A distance R2 from the geometrical center G0 of the projection region of the semiconductor die D in Evaluation Example RB is 2.5 mm. A distance R3 from the geometrical center G0 of the projection region of the semiconductor die D in Evaluation Example RC is 3.5 mm. A distance R4 from the geometrical center G0 of the projection region of the semiconductor die D in Evaluation Example RD is 4.5 mm. A distance R5 from the geometrical center G0 of the projection region of the semiconductor die D in Evaluation Example RE is 5.5 mm.

In Evaluation Example RA, the entirety of the eight thermal vias 350 are in the projection region of the semiconductor die D.

In Evaluation Example RB, among the eight thermal vias 350, six thermal vias 350 are in the projection region of the semiconductor die D, and two thermal vias 350 are located on a boundary line of the projection region of the semiconductor die D.

In Evaluation Example RC, the entirety of the eight thermal vias 350 are out of the projection region of the semiconductor die D, and seven thermal vias 350 are in the projection region of the heat spreader HS.

In Evaluation Example RD, the entirety of the eight thermal vias 350 are out of the projection region of the semiconductor die D. In Evaluation Example RD, two thermal vias 350 are in the projection region of the heat spreader HS, and three thermal vias 350 are on a boundary line of the projection region of the heat spreader HS. In Evaluation Example RD, three thermal vias 350 are out of the projection region of the heat spreader HS.

In Evaluation Example RE, the entirety of the eight thermal vias 350 are out of the projection region of the semiconductor die D. In Evaluation Example RE, two thermal vias 350 are in the projection region of the heat spreader HS, and six thermal vias 350 are out of the projection region of the heat spreader HS.

In FIG. 16, the horizontal axis represents the FET drive elapse time (s: second), the vertical axis represents a copper foil temperature of the conductor foil 310, and digit strings on a right side represent distances from the geometrical center G0 of the projection region of the semiconductor die D in Evaluation Example RA to Evaluation Example RE. In FIG. 17, the horizontal axis represents the FET drive elapse time (s: second), the vertical axis represents a temperature of the semiconductor die D, and digit strings on a right side represent distances from the geometrical center G0 of the projection region of the semiconductor die D in Evaluation Example RA to Evaluation Example RE.

As illustrated in FIG. 16 and FIG. 17, in Evaluation Example RA, Evaluation Example RB, and Evaluation Example RC, an effect of suppressing a die temperature of the semiconductor die D and a copper foil temperature of the conductor foil 310 due to the thermal vias 350 is higher in comparison to Evaluation Example RD and Evaluation Example RE.

As illustrated in FIG. 16 and FIG. 17, when comparing Evaluation Example RA and Evaluation Example RB with each other, the effect of suppressing the die temperature of the semiconductor die D and the copper foil temperature of the conductor foil 310 is higher in Evaluation Example RA in comparison to Evaluation Example RB.

With regard to the FET drive elapse time of five seconds and the FET drive elapse time of ten seconds in FIG. 18, when the horizontal axis represents the distance from the geometrical center G0 of the projection region of the semiconductor die D in Evaluation Example RA to Evaluation Example RE, and the vertical axis represents the die temperature of the semiconductor die D, it can be seen that a distance from the geometrical center G0 of the projection region of the semiconductor die D, at which the temperature suppressing effect is high, is different between the FET drive elapse time of five seconds, and the FET drive elapse time of ten seconds.

In FIG. 18, in a permissible range RP1, the die temperature of the semiconductor die D is suppressed. At the FET drive elapse time of five seconds, the temperature suppressing effect is the highest when the distance from the geometrical center G0 of the projection region of the semiconductor die D is 3 mm in a practical use range RP2.

In contrast, at the FET drive elapse time of ten seconds, the temperature suppressing effect is the highest when the distance from the geometrical center G0 of the projection region of the semiconductor die D is RL.

Figure 24:
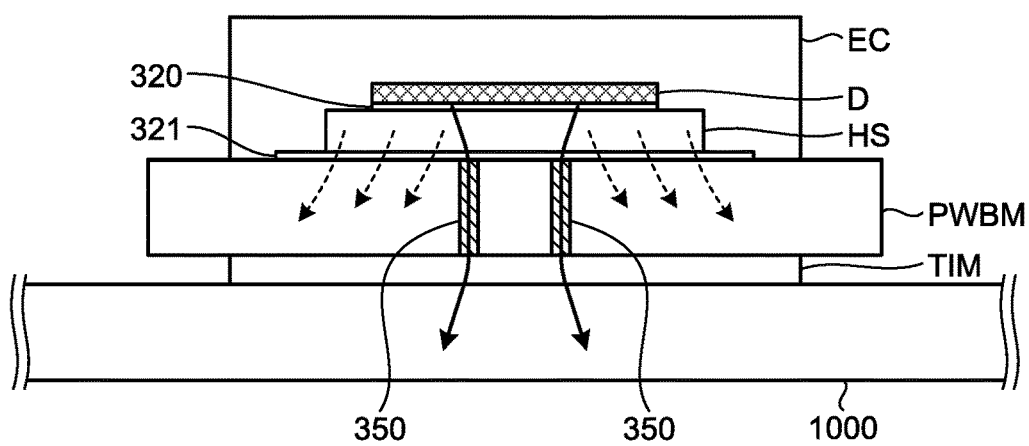
FIG. 24 is a view schematically illustrating a heat transfer path in a case where the thermal vias are disposed on an inner side of an electronic component projection region.

FIG. 24 is a view schematically illustrating a heat transfer path in a case where the thermal vias are disposed on an inner side of an electronic component projection region. As illustrated in FIG. 24, when the thermal vias 350 are disposed in a projection region of a heat generating portion such as the semiconductor die D, as indicated by solid-line arrows, heat is transferred to the heat sink 1000 through the thermal vias 350. However, as indicated by broken-line arrows, heat cannot be efficiently transferred to the heat sink 1000 at a portion in which the thermal vias 350 are not disposed. When an area of a portion in which the thermal vias 350 are disposed is excessively smaller than an area of the projection region of the heat generating portion such as the semiconductor die D, heat characteristics transferred to the heat sink 1000 through the thermal vias 350 deteriorate. Accordingly, as illustrated in FIG. 16 and FIG. 17, the effect of suppressing the die temperature of the semiconductor die D and the copper foil temperature of the conductor foil 310 is higher in Evaluation Example RA in comparison to Evaluation Example RB.

Figure 25:
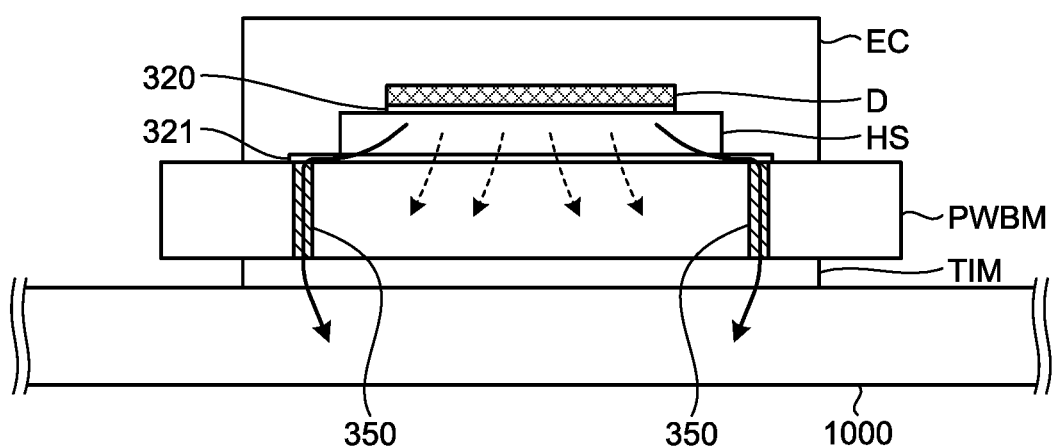
FIG. 25 is a view schematically illustrating the heat transfer path in a case where the thermal vias are disposed on an outer side of the electronic component projection region.

FIG. 25 is a view schematically illustrating the heat transfer path in a case where the thermal vias are disposed on an outer side of the electronic component projection region. When the thermal vias 350 are disposed on an outer side of the projection region of the heat generating portion such as the semiconductor die D illustrated in FIG. 25, heat is transferred to the heat sink 1000 through the thermal vias 350 as indicated by solid-line arrows. In this case, the heat dissipation path of heat generated from the semiconductor die D is excessively long, and thus a heat dissipation effect deteriorates, and as indicated by broken-line arrows, heat cannot also be efficiently transferred to the heat sink 1000 at a portion in which the thermal vias 350 are not disposed.

Typically, it is preferable that thermal energy is dissipated at a shortest distance. However, when a surface area (heat dissipation area) that receives the thermal energy is small, thermal energy that is received per unit time decreases. In contrast, when the heat dissipation area is large, the heat dissipation path is lengthened, and thus heat dissipation properties of thermal energy deteriorate. Accordingly, it is necessary to take a balance between the shortest distance and the heat dissipation area in the heat generating portion such as the semiconductor die D.

Figure 26:
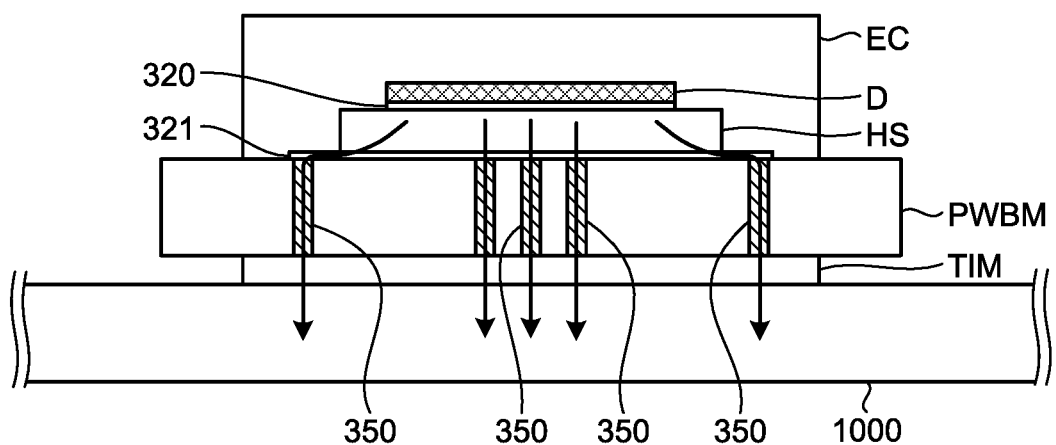
FIG. 26 is a view schematically illustrating the heat transfer path in a case where the thermal vias are disposed on the inner side and the outer side of the electronic component projection region.

FIG. 26 is a view schematically illustrating the heat transfer path in a case where the thermal vias are disposed on the inner side and the outer side of the electronic component projection region. For example, as illustrated in FIG. 26, in a case where the thermal vias 350 are disposed on the inner side and the outer side of the projection region of the semiconductor die D, heat generated from the semiconductor die D of the electronic component EC, which is indicated by solid-line arrows, is transferred to the heat sink 1000 by the thermal vias 350 on the inner side of the projection region of the semiconductor die D, and particularly, transient heat is transferred to the heat sink 1000 by the thermal vias 350. In addition, with regard to the thermal vias 350 on the outer side of the projection region of the semiconductor die D, it is also possible to increase the amount of heat (thermal energy that may be gradually dissipated to a certain extent) that is generated in the semiconductor die D and is received therefrom at a time by enlarging a surface area of the heat transfer path in combination with the thermal vias 350 disposed on the inner side.

Figure 27:
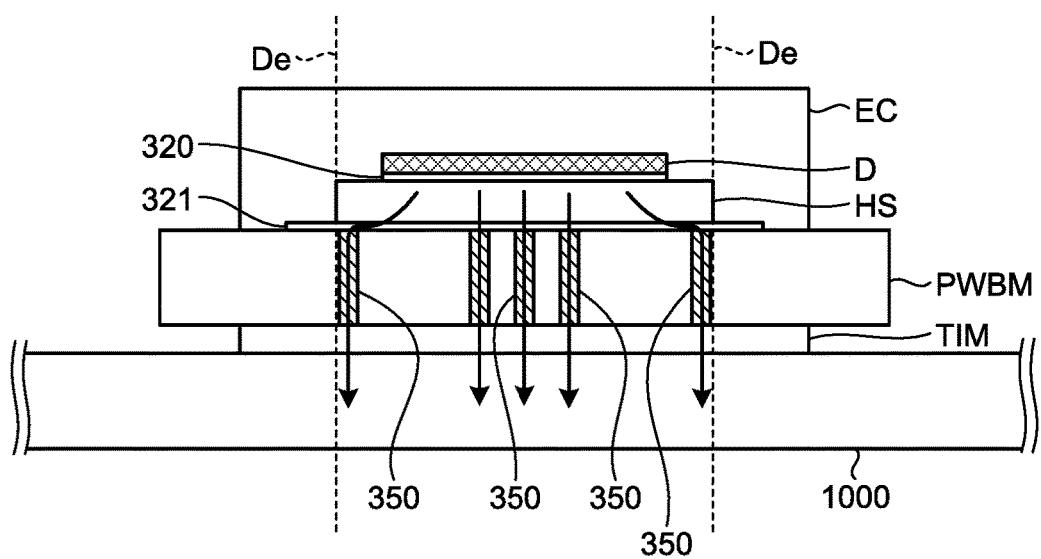
FIG. 27 is a view schematically illustrating the heat transfer path in a case where the thermal vias are disposed on the inner side and the outer side of the electronic component projection region.

FIG. 27 is a view schematically illustrating the heat transfer path in a case where the thermal vias are disposed on the inner side and the outer side of the electronic component projection region. For example, as illustrated in FIG. 27, the thermal vias 350 are disposed on an inner side and an outer side of the projection region of the semiconductor die D, and the thermal vias 350 disposed on the outer side of the projection region of the semiconductor die D are located in the vicinity of an outer edge De of the heat spreader HS and on an inner side of the projection region of the heat spreader HS. According to this structure, a surface area of the heat spreader HS effectively operates as a heat dissipation area, and heat (thermal energy that may be gradually dissipated to a certain extent) that is generated in the semiconductor die D is transferred to the heat sink 1000 through the thermal vias 350 on the outer side of the projection region of the semiconductor die D.

Evaluation 3

Figure 28:
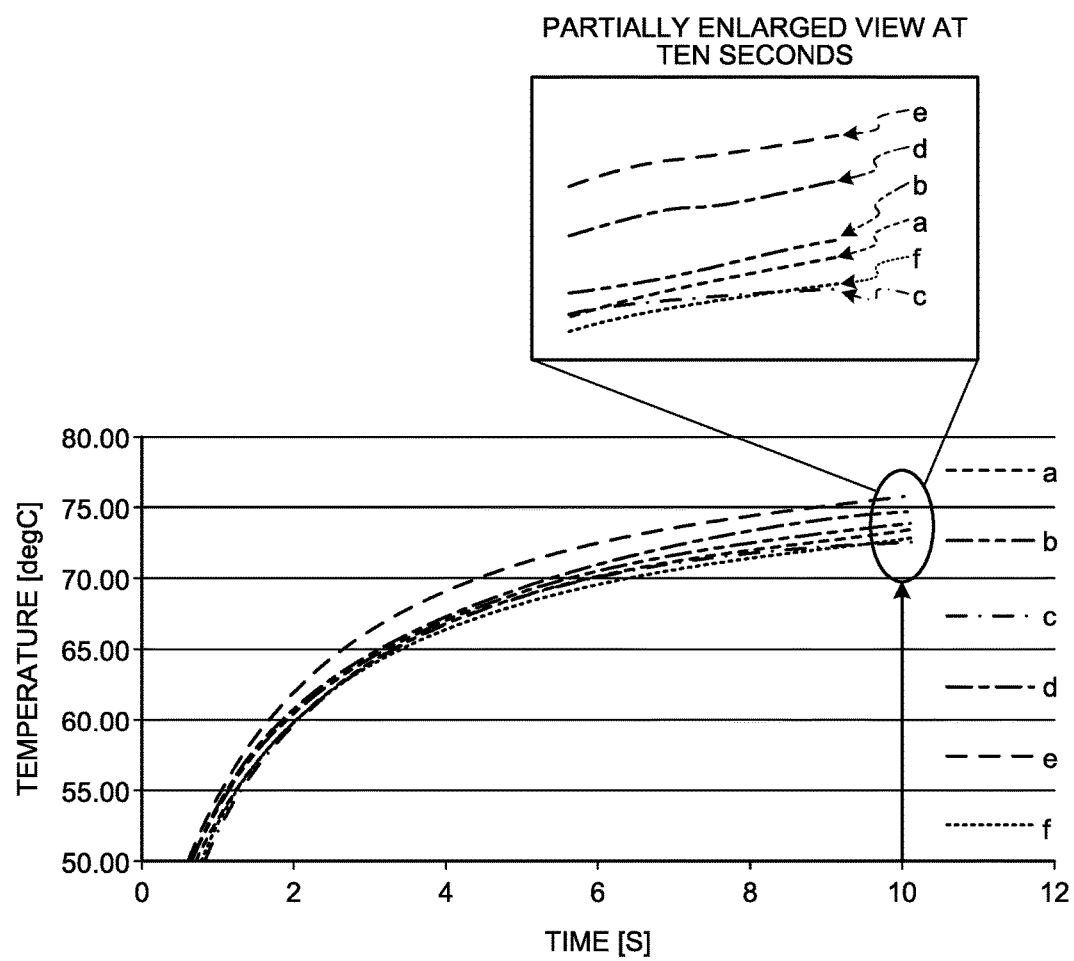
FIG. 28 is a graph illustrating a temporal variation of a die temperature in Evaluation Example a to Evaluation Example f.
Figure 29:
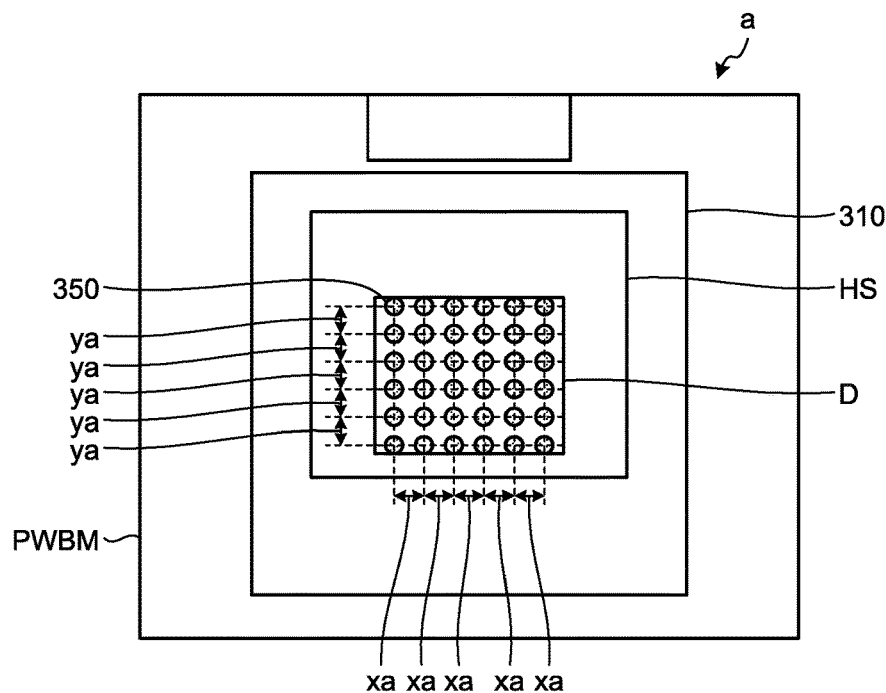
Figure 30:
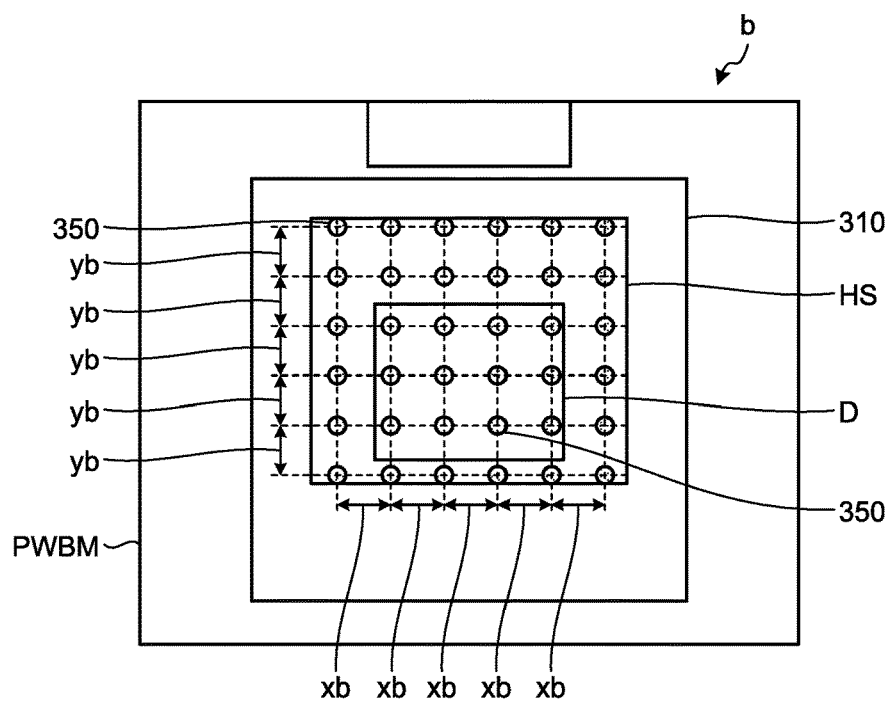
FIG. 30 is a plan view illustrating arrangement of the thermal vias in Evaluation Example b.
Figure 31:
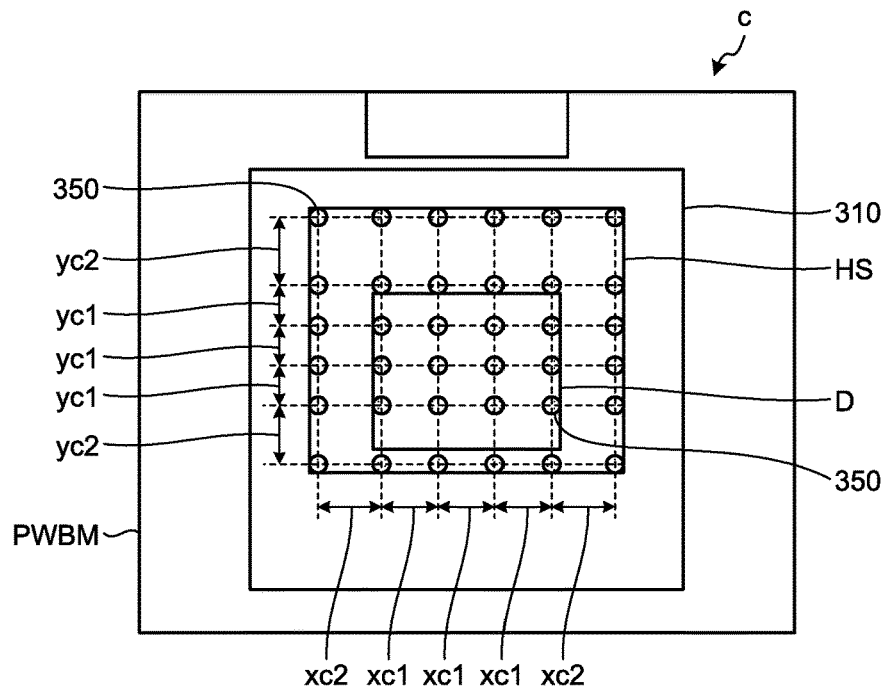
FIG. 31 is a plan view illustrating arrangement of the thermal vias in Evaluation Example c.
Figure 32:
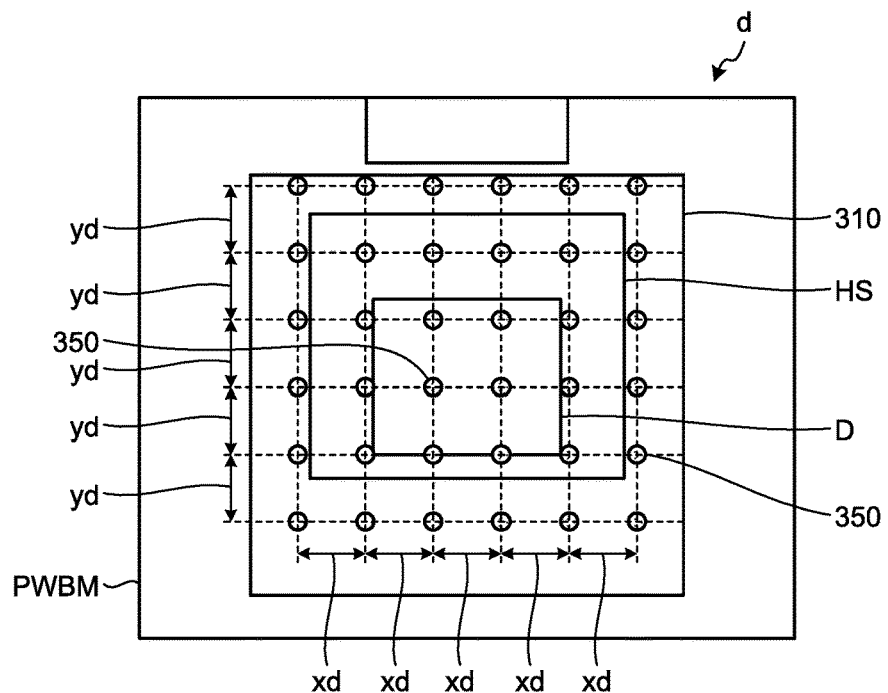
FIG. 32 is a plan view illustrating arrangement of the thermal vias in Evaluation Example d.
Figure 33:
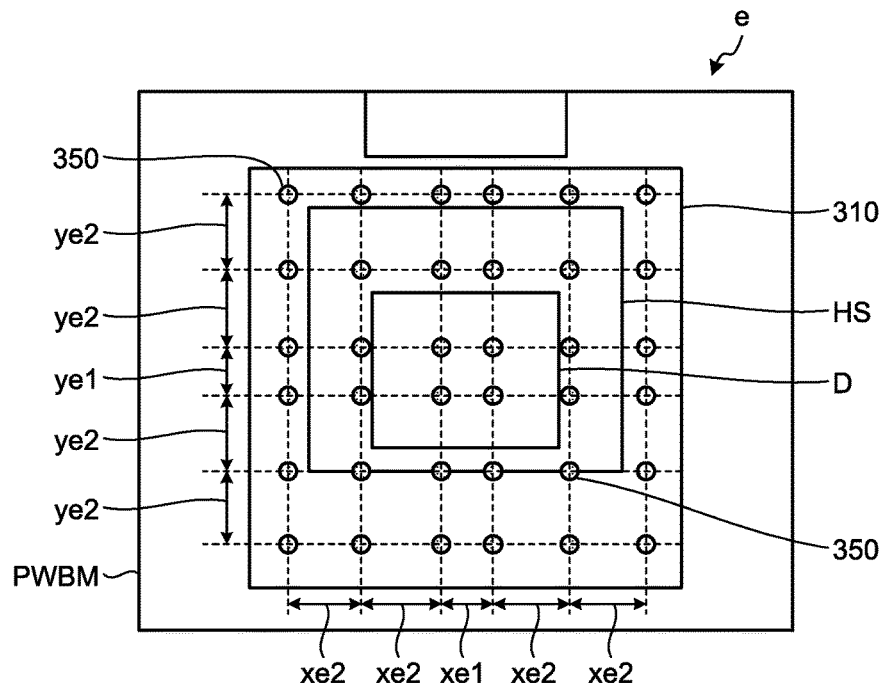
FIG. 33 is a plan view illustrating arrangement of the thermal vias in Evaluation Example e.
Figure 34:
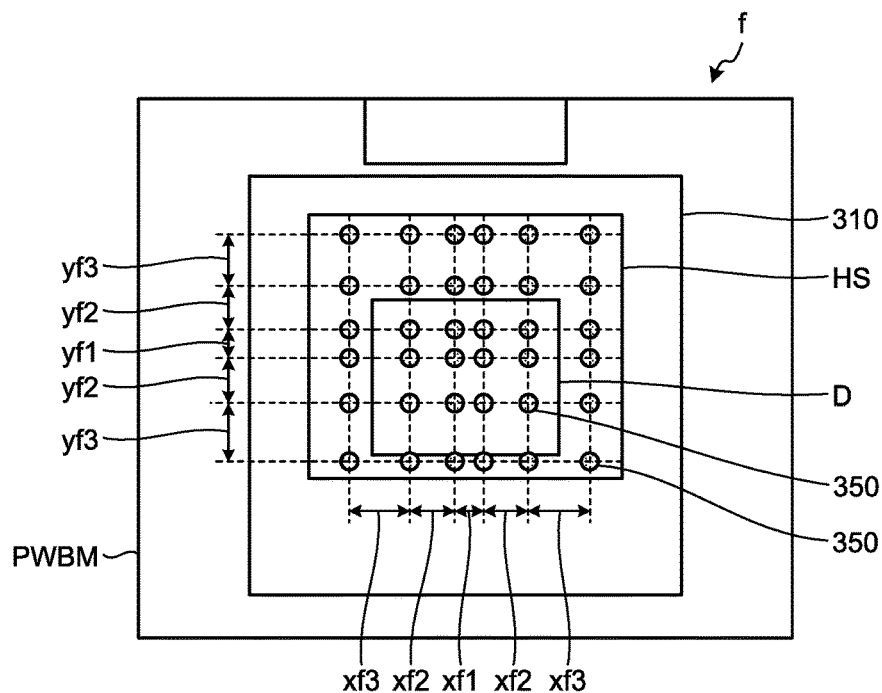
FIG. 34 is a plan view illustrating arrangement of the thermal vias in Evaluation Example f.

FIG. 28 is a graph illustrating a temporal variation of a die temperature in Evaluation Example a to Evaluation Example f. FIG. 29 is a plan view illustrating arrangement of the thermal vias in Evaluation Example a. FIG. 30 is a plan view illustrating arrangement of the thermal vias in Evaluation Example b. FIG. 31 is a plan view illustrating arrangement of the thermal vias in Evaluation Example c. FIG. 32 is a plan view illustrating arrangement of the thermal vias in Evaluation Example d. FIG. 33 is a plan view illustrating arrangement of the thermal vias in Evaluation Example e. FIG. 34 is a plan view illustrating arrangement of the thermal vias in Evaluation Example f.

As Evaluation 3, a temporal variation of the die temperature is simulated in Evaluation Example a to Evaluation Example f to be described below in a case where the number of the thermal vias 350 is 36, and an area of the heat spreader HS is 100 mm$^2$.

As illustrated in FIG. 29, in Evaluation Example a, the thermal vias 350 are uniformly disposed in the projection region of the semiconductor die D at an interval xa and an interval ya which are both set to 0.5 mm.

As illustrated in FIG. 30, in Evaluation Example b, the thermal vias 350 are uniformly disposed in the projection region of the heat spreader HS at an interval xb and an interval yb which are both set to 2.0 mm.

As illustrated in FIG. 31, in Evaluation Example c, the thermal vias 350 are disposed in the projection region of the heat spreader HS at an interval xc1 and an interval yc1 which are set to 2.0 mm, and an interval xc2 and an interval yc2 which are set to 2.5 mm.

As illustrated in FIG. 32, in Evaluation Example d, the thermal vias 350 are uniformly disposed at an interval xd and an interval yd which are both set to 3.0 mm. In Evaluation Example d, the thermal vias 350 exist on both of the inner side and the outer side of the projection region of the heat spreader HS.

As illustrated in FIG. 33, in Evaluation Example e, the thermal vias 350 are disposed at an interval xe1 and an interval ye1 which are set to 2.0 mm, and an interval xe2 and an interval ye2 which are set to 3.0 mm. In Evaluation Example e, the thermal vias 350 exist on both of the inner side and the outer side of the projection region of the heat spreader HS.

As illustrated in FIG. 34, in Evaluation Example f, the thermal vias 350 are disposed in the projection region of the heat spreader HS at an interval xf1 and an interval yf1 which are set to 0.5 mm, an interval xf2 and an interval yf2 which are set to 0.75 mm, and an interval xf3 and an interval yf3 which are set to 1.0 mm.

As illustrated in FIG. 28, according to simulation results relating to Evaluation 3, at the FET drive elapse time of ten seconds, the effect of suppressing the temperature of the semiconductor die D becomes high in the order of Evaluation Example c, Evaluation Example f, Evaluation Example a, Evaluation Example b, Evaluation Example d, and Evaluation Example e.

In Evaluation Example d and Evaluation Example e, twenty thermal vias 350 among thirty six thermal vias 350 are out of the projection region of the heat spreader HS. With regard to the thermal vias 350 out of the projection region of the heat spreader HS, it is considered that a heat dissipation path of receiving thermal energy is long, and thus thermal energy is accumulated in the heat dissipation path and is less likely to be dissipated. In Evaluation Example e, four thermal vias 350 exist at a position that overlaps the edge of the heat spreader HS. Accordingly, in Evaluation Example e, the number of the thermal vias 350 which completely overlap the projection region of the heat spreader HS is smaller in comparison to Evaluation Example d. In Evaluation Example d, the conductor foil 310, which overlaps the heat spreader HS, can be more effectively utilized as the heat dissipation area in comparison to Evaluation Example e.

In Evaluation Example b, the entirety of the thermal vias 350 are disposed in the projection region of the heat spreader HS. Heat of the semiconductor die D is transferred to the heat sink 1000 through the thermal vias 350 while spreading in the projection region of the heat spreader HS, but the interval between the thermal vias 350 is the same in each case. Accordingly, it is considered that heat is less likely to be dissipated at the central portion of the semiconductor die D.

In Evaluation Example a, the entirety of the thermal vias 350 are disposed in the projection region of the semiconductor die D. Heat of the semiconductor die D is transferred to the heat sink 1000 through the thermal vias 350 while spreading in the projection region of the semiconductor die D, but a surface density of the thermal vias 350 is excessively high. Accordingly, it is considered that heat is less likely dissipated through the heat spreader HS.

In Evaluation Example f, an interval between the thermal vias 350 adjacent to each other becomes gradually wider from an inner side to an outer side in the projection region of the semiconductor die D. Similarly, an interval between the thermal vias 350 adjacent to each other becomes gradually wider from an inner side to an outer side in the projection region of the heat spreader HS. When employing this configuration, a projection area of the semiconductor die D equivalent to the heat generating portion can be set to a region (dense portion) in which the surface density of the thermal vias 350 is the highest. At the periphery of the region (dense portion) in which the surface density of the thermal vias 350 is the highest, the surface density of the thermal vias gradually decreases from the inner side to the outer side in the projection region of the heat spreader HS, and thus the amount of heat that is generated in the semiconductor die D and is received at a time is increased by enlarging a surface area of the heat transfer path.

In Evaluation Example c, the intervals xc1 and yc1 between the thermal vias 350, which are disposed on an inner side in the projection region of the semiconductor die D and are adjacent to each other, are smaller than the intervals xc2 and yc2 of the thermal vias 350 which are disposed on an outer side in the projection region of the semiconductor die D and are adjacent to each other. When employing this configuration, a projection area of the semiconductor die D equivalent to the heat generating portion can be set to a region (dense portion) in which the surface density of the thermal vias 350 is the highest. At the periphery of the region (dense portion) in which the surface density of the thermal vias 350 is the highest, the surface density of the thermal vias gradually decreases from the inner side to the outer side in the projection region of the heat spreader HS, and thus the amount of heat that is generated in the semiconductor die D and is received at a time is increased by enlarging the surface area of the heat transfer path.

In Evaluation Example c, the thermal vias 350 on the outer side of the projection region of the semiconductor die D exist in the vicinity of an outer edge of the heat spreader HS and on an inner side of the projection region of the heat spreader HS. According to this structure, the surface area of the heat spreader HS more effectively operates as a heat dissipation area in comparison to Evaluation Example b, and heat (thermal energy that may be gradually dissipated to a certain extent) that is generated in the semiconductor die D is transferred to the heat sink 1000 through the thermal vias 350 on the outer side of the projection region of the semiconductor die D. As described above, in Evaluation Example c, the conductor foil 310, which overlaps the heat spreader HS, can be more effectively utilized as the heat dissipation area in comparison to Evaluation Example b.

In Evaluation Example c and Evaluation Example f, the effect of suppressing the temperature of the semiconductor die D is high to approximately the same degree. In detail evaluation, the effect of suppressing the temperature of the semiconductor die D at the FET drive elapse time of ten seconds is higher in Evaluation Example c in comparison to Evaluation Example f. In evaluation in combination with the evaluation result of Evaluation 2, in a case where the FET drive elapse time is lengthened and the amount of heat generation of the semiconductor die D increases, it is possible to secure the amount of heat, which is generated in the semiconductor die D and is received at a time, in a portion in which the interval between the thermal vias 350 is wide in comparison to a region (dense portion) in which the surface density of the thermal vias 350 is the highest.

Evaluation 4

Figure 35:
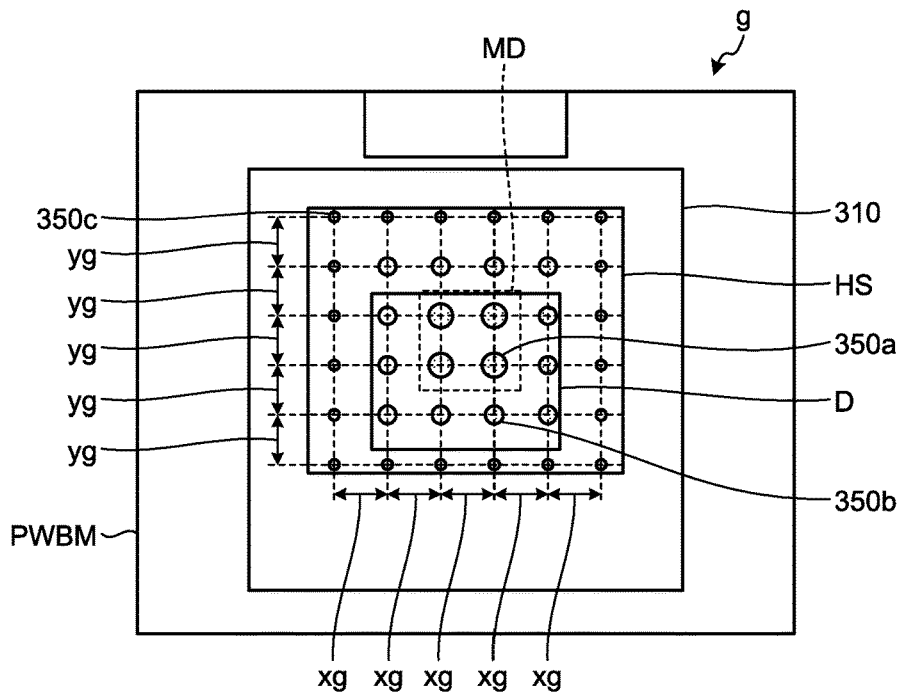
FIG. 35 is a plan view illustrating arrangement of the thermal vias in Evaluation Example g.
Figure 36:
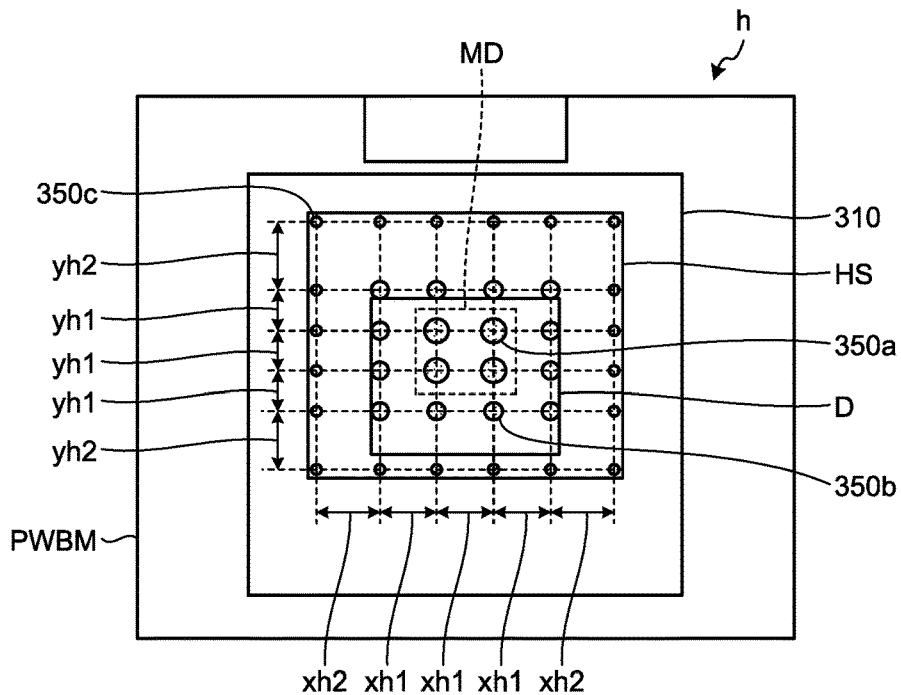
FIG. 36 is a plan view illustrating arrangement of the thermal vias in Evaluation Example h.
Figure 37:
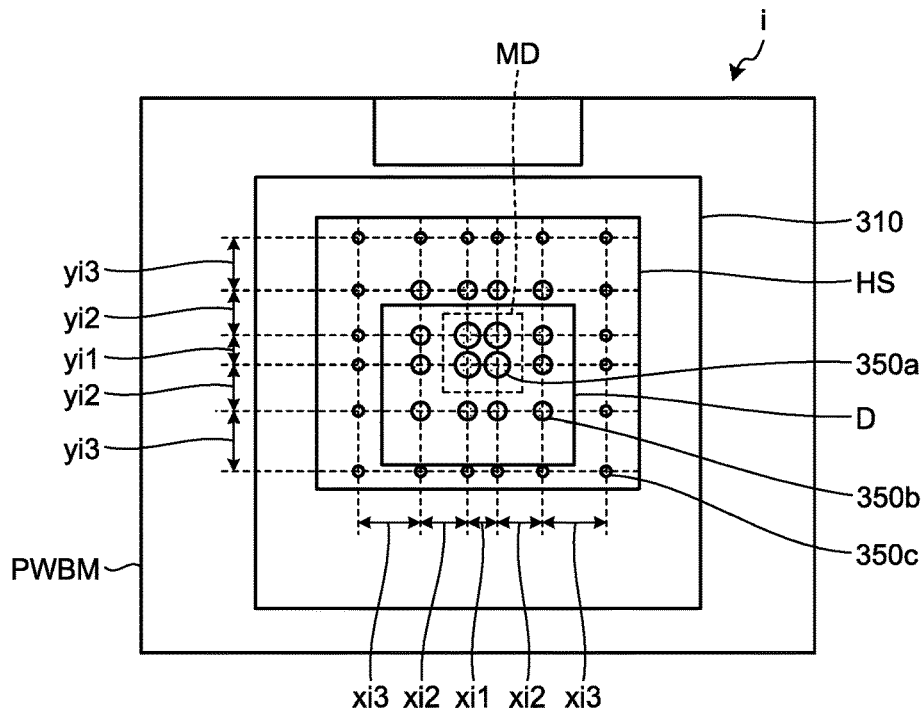
FIG. 37 is a plan view illustrating arrangement of the thermal vias in Evaluation Example i.

FIG. 35 is a plan view illustrating arrangement of the thermal vias in Evaluation Example g. FIG. 36 is a plan view illustrating arrangement of the thermal vias in Evaluation Example h. FIG. 37 is a plan view illustrating arrangement of the thermal vias in Evaluation Example i.

As illustrated in FIG. 35, even in Evaluation Example g, a total number of thermal vias 350a, 350b, and 350c is 36, and an area of the heat spreader HS is 100 mm². When a height (substrate thickness) of the thermal vias is set as ht, a diameter of a shape (opening shape) of the thermal vias 350a in a plan view is ht×1.0 mm. A diameter of a shape (opening shape) of the thermal vias 350b in a plan view is ht×0.9 mm. A diameter of a shape (opening shape) of the thermal vias 350c in a plan view is ht×0.8 mm. The shape (opening shape) of each of the thermal vias 350a, 350b, and 350c in a plan view and an inner diameter of an inner wall of each of the thermal vias 350a, 350b, and 350c are the same. As described above, the inner diameters of the thermal vias 350a, 350b, and 350c are different from each other. The inner diameter of the thermal vias 350b is smaller than the inner diameter of the thermal vias 350a and is larger than the inner diameter of the thermal via 350c. Furthermore, the thermal vias 350a, 350b, and 350c are uniformly disposed in the projection region of the heat spreader HS at an interval xg and an interval yg which are both set to 2.0 mm. Furthermore, the inner diameter of the thermal vias 350a, 350b, and 350c is equal to or less than the thickness of the heat dissipation substrate 300.

As illustrated in FIG. 35, the inner diameters of the thermal vias 350a, 350b, and 350c are different from each other, and thus the surface density of the thermal vias is partially different. Since the thermal vias 350a, 350b, and 350c are uniformly disposed, the larger the shape (opening shape) of the thermal vias 350 in a plan view is, the greater the surface density of the thermal vias 350 becomes. Accordingly, the surface density of the thermal vias 350 per unit area becomes the greatest in a dense portion MD on an inner side in comparison to an edge portion of the projection region of the heat spreader HS. According to this, in correspondence with the heat generation distribution on the bottom surface side of the electronic component, the thermal vias 350a are disposed in a region in which the amount of heat generation of the bottom surface of the electronic component is large, and the thermal vias 350c are disposed in a region in which the amount of heat generation of the bottom surface of the electronic component is small.

As illustrated in FIG. 36, even in Evaluation Example h, a total number of the thermal vias 350a, 350b, and 350c is 36, and the area of the heat spreader HS is 100 mm². The diameter of the shape (opening shape) of the thermal vias 350a, the thermal vias 350b, and the thermal vias 350c in a plan view is the same as in Evaluation Example g.

As illustrated in FIG. 36, the inner diameters of the thermal vias 350a, 350b, and 350c are different from each other, and thus the surface density of the thermal vias is partially different. In addition, as an arrangement interval of the thermal vias 350a and 350b, an interval xh1 and an interval yh1 are set to 2.0 mm. In addition, as an arrangement interval of the thermal vias 350b and 350c, an interval xh2 and an interval yh2 are set to 2.5 mm. The arrangement interval of the thermal vias 350b and 350c is greater than the arrangement interval of the thermal vias 350a and 350b. Accordingly, the surface density of the thermal vias 350 per unit area gradually decreases from an inner side of the projection region of the heat spreader HS over an edge portion. As a result, even in a heat generation distribution having a large temperature difference between a region in which the amount of heat generation of the bottom surface of the electronic component is large, and a region in which the amount of heat generation of the bottom surface of the electronic component is small, the heat dissipation substrate in Evaluation Example h can improve heat dissipation properties of the electronic component.

As illustrated in FIG. 37, even in Evaluation Example i, a total number of the thermal vias 350a, 350b, and 350c is 36, and the area of the heat spreader HS is 100 mm². The diameter of the shape (opening shape) of the thermal vias 350a, the thermal vias 350b, and the thermal vias 350c in a plan view is the same as in Evaluation Example g.

As illustrated in FIG. 37, the inner diameters of the thermal vias 350a, 350b, and 350c are different from each other, and thus the surface density of the thermal vias is partially different. In addition, as an arrangement interval of the thermal vias 350a and 350a, an interval xi1 and an interval yi1 are set to 0.5 mm. In addition, as an arrangement interval of the thermal vias 350a and 350b, an interval xi2 and an interval yi2 are set to 0.75 mm. In addition, as an arrangement interval of the thermal vias 350b and 350c, an interval xi3 and an interval yi3 are set to 1.0 mm.

As illustrated in FIG. 37, inner diameters of a plurality of the thermal vias 350a, 350b, and 350c decrease in inverse proportion to enlargement of the arrangement interval (pitch). Accordingly, the surface density of the thermal vias 350 per unit area gradually decreases from the inner side of the projection region of the heat spreader HS over the edge portion. As a result, even in a heat generation distribution having a larger temperature difference between a region in which the amount of heat generation of the bottom surface of the electronic component is large, and a region in which the amount of heat generation of the bottom surface of the electronic component is small in comparison to Evaluation Example h, the heat dissipation substrate in Evaluation Example i can improve heat dissipation properties of the electronic component.

As described above, in the heat dissipation substrate of Evaluation Example g, Evaluation Example h, or Evaluation Example i, in correspondence with the arrangement of the thermal vias 350a, 350b, and 350c, heat of the mounting surface is conducted in the substrate thickness direction, and can be conducted to the outside of the substrate in an efficient manner and at the low cost. In addition, even in a case where a heat distribution of the mounting surface is temporally different, when the temperature of the mounting surface is low, heat of the mounting surface is conducted in the substrate thickness direction by the thermal vias 350*a* in the dense portion MD. In addition, when the temperature of the mounting surface is high, heat of the mounting surface is conducted in the substrate thickness direction by the thermal vias 350*b* and 350*c* which exist at the periphery of the dense portion MD, and the amount of heat received from the mounting surface at a time increases.

Figure 38:
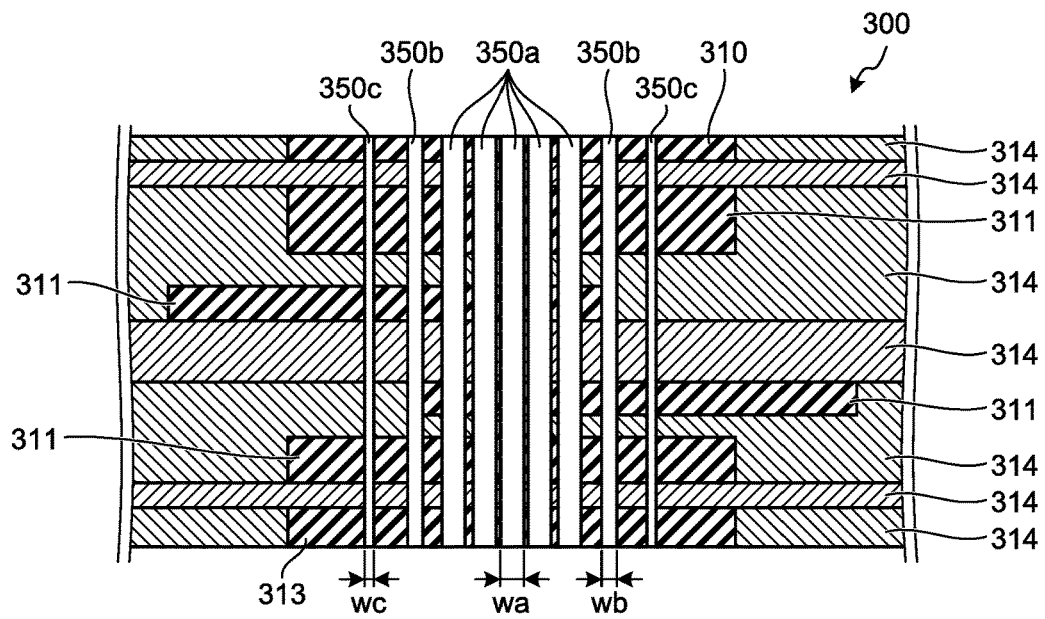
FIG. 38 is a partial cross-sectional view schematically illustrating a cross-sectional structure of a heat dissipation substrate according to a fourth modification example of this embodiment.
Figure 39:
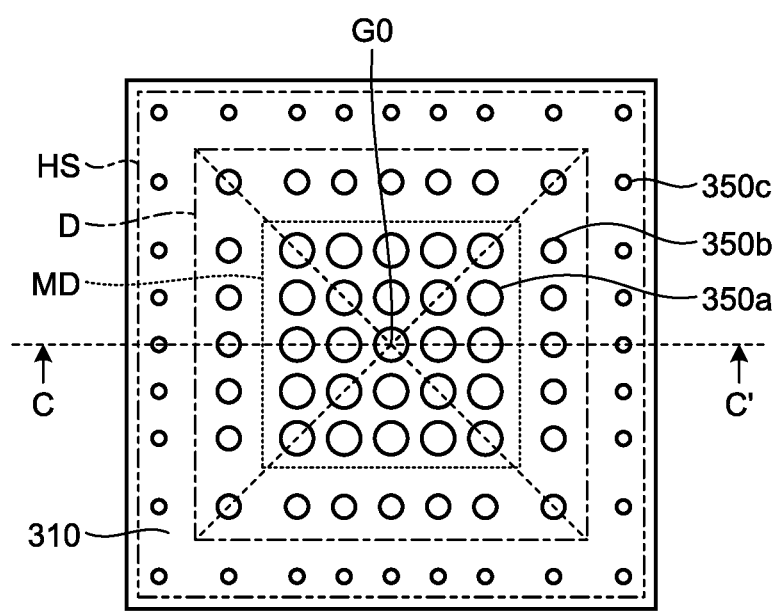
FIG. 39 is a plan view illustrating an arrangement example of thermal vias in a heat dissipation substrate according to the fourth modification example of this embodiment.

Arrangement of the thermal vias 350*a*, 350*b*, and 350*c* described in Evaluation Example g, Evaluation Example h, and Evaluation Example i may be appropriately changed. FIG. 38 is a partial cross-sectional view schematically illustrating a cross-sectional structure of a heat dissipation substrate according to a fourth modification example of this embodiment. FIG. 39 is a plan view illustrating an arrangement example of thermal vias in a heat dissipation substrate according to the fourth modification example of this embodiment. The cross-section of the heat dissipation substrate in FIG. 38 corresponds to a cross-section taken along line C-C' in FIG. 39. In the heat dissipation substrate according to the fourth modification example of this embodiment, a total number of the thermal vias 350*a*, 350*b*, and 350*c* is 81 differently from Evaluation Example g, Evaluation Example h, and Evaluation Example i. The inner diameters of the thermal vias 350*a*, the thermal vias 350*b*, and the thermal vias 350*c* are the same as in Evaluation Example g.

In the heat dissipation substrate according to the fourth modification example of this embodiment, the surface density of the thermal vias 350 per unit area is the largest in the dense portion MD on an inner side in comparison to the edge portion of the projection region of the heat spreader HS. According to this, in correspondence with the heat generation distribution on the bottom surface side of the electronic component, the thermal vias 350*a* are disposed in a region in which the amount of heat generation of the bottom surface of the electronic component is large, and the thermal vias 350*c* are disposed in a region in which the amount of heat generation of the bottom surface of the electronic component is small. In addition, the dense portion MD of the thermal vias 350 is located at a position that overlaps the geometrical center G0 of the above-described semiconductor die D in a plan view.

As illustrated in FIG. 38, when a diameter of the thermal vias 350*a* is set as wa, a diameter of the thermal vias 350*b* is set as wb, a diameter of the thermal vias 350*c* is set as wc, and a height of the thermal vias is set as ht, copper foil increased areas of the thermal vias 350*a*, 350*b*, and 350*c* per one piece become sa, sb, and sc, and can be calculated from the following Expression (2) to Expression (4).

$$Sa = (2\pi(wa/2) \times ht - 2 \times \pi(wa/2)^2) \quad (2)$$

$$Sb = (2\pi(wb/2) \times ht - 2 \times \pi(wb/2)^2) \quad (3)$$

$$Sc = (2\pi(wc/2) \times ht - 2 \times \pi(wc/2)^2) \quad (4)$$

In addition, in the geometrical center G0 of the semiconductor die D, the copper foil increased area is Sa, and as it is spaced away from the geometrical center G0 of the semiconductor die D, the copper foil increased area per one thermal via decreases in the order of the copper foil increased area Sb and the copper foil increased area Sc. Accordingly, in a case where the temperature of the mounting surface is low, heat of the mounting surface is conducted in the substrate thickness direction by the thermal vias 350*a* of which the copper foil increased area per one piece is large. In a case where the temperature of the mounting surface is high, heat of the mounting surface is conducted in the substrate thickness direction by the thermal vias 350*b* and the thermal vias 350*c* of which the copper foil increased area per one piece is small and which exist at the periphery of the dense portion MD, and the amount of heat received from the mounting surface at a time increases.

In the electric power steering device 80, in a case where the heat dissipation substrate 300 according to the fourth modification example of this embodiment is mounted on the ECU 2, it is preferable that the thermal vias 350*a*, 350*b*, and 350*c* are arranged as follows.

First, description will be made with reference to FIG. 18 and FIG. 39. As in Evaluation 2, first correlation information between a temperature of the semiconductor die D of the FET at a first drive time (for example, five seconds) as a short FET drive elapse time, and a distance of a range in which the thermal vias are disposed from the geometrical center G0 of the projection region of the semiconductor die D is obtained as a first condition. In addition, second correlation information between a temperature of the semiconductor die D of the FET at a second drive time (for example, ten seconds) as an FET drive elapse time longer than the first drive time (for example, five seconds), and a distance of a range in which the thermal vias are disposed from the geometrical center G0 of the projection region of the semiconductor die D is obtained as a second condition. According to the first correlation information, a distance (practical use range RP2) of a region in which the thermal vias are disposed from the geometrical center G0 of the projection region of the semiconductor die D in which the temperature of the semiconductor die D of the FET becomes the lowest is obtained. In addition, according to the second correlation information, a distance (distance RL) of a region in which the thermal vias are disposed from the geometrical center G0 of the projection region of the semiconductor die D in which the temperature of the semiconductor die D of the FET becomes the lowest is obtained.

In the dense portion MD illustrated in FIG. 39, a plurality of the thermal vias 350*a* is disposed. The size of one side of the dense portion MD is set as a distance RL from the geometrical center G0 of the projection region of the semiconductor die D illustrated in FIG. 18. A plurality of the thermal vias 350*b* is disposed in a range that is greater than the distance RL from the geometrical center G0 of the projection region of the semiconductor die D illustrated in FIG. 18, and is equal to or less than the maximum value of the permissible range RP1. A plurality of the thermal vias 350*c* is disposed in a range that is set to a distance from the geometrical center G0 of the projection region of the semiconductor die D illustrated in FIG. 18, and is greater than the maximum value of the permissible range RP1.

In the electric power steering device 80, in a case of mounting the heat dissipation substrate 300 according to the fourth modification example of this embodiment on the ECU 2, it is possible to suppress the temperature of the semiconductor die D of the FET at the FET drive elapse time of five seconds due to the thermal vias 350*a* in the dense portion MD.

In addition, because the thermal vias 350*b* which exist at the periphery of the dense portion MD are in the permissible range RP1, it is possible to suppress the temperature of the semiconductor die D of the FET at the FET drive elapse time of ten seconds.

In a case where a rank end edge or driving wheels interfere with a curbstone and the like, mainly, the temperature of the mounting surface of the electronic component such as the FET greatly varies. In a case where the temperature of the mounting surface is low at the first drive time (for example, five seconds), heat of the mounting surface is conducted in the thickness direction of the heat dissipation substrate 300 by the thermal vias 350a in the dense portion MD. In a case where the temperature of the mounting surface becomes high at the second drive time (for example, ten seconds), heat of the mounting surface is conducted in the substrate thickness direction by the thermal vias 350b in a second direction from an inner side to an outer side of the electronic component projection region at the periphery of the dense portion MD, and heat of the mounting surface is received at a time at the second drive time (for example, ten seconds). In addition, the surface area of the heat spreader HS effectively operates as a heat dissipation area, and heat (thermal energy that may be gradually dissipated to a certain extent) that is generated in the semiconductor die D is transferred to the heat sink 1000 through the thermal vias 350c on the outer side of the projection region of the semiconductor die D. According to this, failure of the control unit 2 is suppressed.

In addition, sizes and ratios, or scales and the like in the drawing of the electronic component EC and the heat dissipation substrate 300 may be expressed after being appropriately changed from actual values for easy understanding of the invention in some cases. In addition, the electronic component EC is used as a general term of various electronic components, and the high heat generation electronic component such as the FET and a capacitor for power supply, and other electronic components are also included in the electronic component EC. In addition, the copper foil temperature is exemplified, but the conductor foil is not limited to copper, and arbitrary conductor foil of a conductive thin film may be employed.

REFERENCE SIGNS LIST

2 CONTROL UNIT (ECU)
20 MOTOR
80 ELECTRIC POWER STEERING DEVICE
300 HEAT DISSIPATION SUBSTRATE
310, 311, 313 CONDUCTOR FOIL
314 INSULATING LAYER
350, 350a, 350b, 350c THERMAL VIA
1000 HEAT SINK
D SEMICONDUCTOR DIE
EC ELECTRONIC COMPONENT
G0 GEOMETRICAL CENTER
HS HEAT SPREADER
ht HEIGHT OF THERMAL VIA (SUBSTRATE THICKNESS)
MD DENSE PORTION
PWBM EVALUATION SUBSTRATE
Th STEERING TORQUE SIGNAL
Vel VEHICLE SPEED SIGNAL
Vref VOLTAGE CONTROL COMMAND VALUE

The invention claimed is:
1. A control unit controlling a motor in an electronic power steering device, comprising:
a heat dissipation substrate including
an electronic component including a semiconductor die of a field effect transistor and a heat spreader that is joined to a lower surface of the semiconductor die, and
a plurality of thermal vias which pass through a mounting surface on which the heat spreader is mounted, a rear surface of the mounting surface, and the heat dissipation substrate between the mounting surface and the rear surface; and
a heat sink provided on a rear surface side of the mounting surface and conducting heat of the heat dissipation substrate at least on a rear surface of the heat spreader through a thermal interface material;
wherein in the heat dissipation substrate,
at least the plurality of thermal vias are disposed in a projection region of the heat spreader in which the heat spreader is projected to the mounting surface in a direction perpendicular to the mounting surface,
the plurality of thermal vias include a metal thin film on an inner wall of a through-hole passing through the heat dissipation substrate between the mounting surface and a rear surface of the mounting surface,
a surface density of the plurality of thermal vias which occupy the mounting surface per unit area is at least partially different,
the plurality of thermal vias do not exist on an outer side of the projection region of the heat spreader,
the plurality of thermal vias surrounding a periphery of the semiconductor die are disposed in a vicinity of an outer edge of the heat spreader, the plurality of thermal vias being disposed on an outer side in a projection region of the semiconductor die and in the projection region of the heat spreader,
the plurality of thermal vias include: a first thermal via located in the vicinity of the outer edge or the heat spreader; a second thermal via located inside the projection region of the semiconductor die and adjacent to the first thermal via, and a third thermal via located on an inner side of the projection region of the semiconductor die more than the adjacent second thermal via is located, and
an arrangement interval between the first thermal via and the second thermal via is larger than an arrangement interval between the third thermal via and the adjacent second thermal via.

2. The control unit according to claim 1,
wherein a total increased area of a conductor foil which increases due to the plurality of thermal vias is 50 mm$^2$ or greater with respect to an area of 100 mm$^2$ of the conductor foil on the mounting surface.

3. The control unit according to claim 1,
wherein an inner diameter of the plurality of thermal vias is equal to or less than the thickness of the heat dissipation substrate.

4. The control unit according to claim 1,
wherein the plurality of thermal vias includes thermal vias having inner diameters different from each other.

5. The control unit according to claim 4,
wherein when an arrangement interval of the thermal vias adjacent to each other increases, an inner diameter of the thermal vias decreases.

6. The control unit according to claim 1,
wherein the heat dissipation substrate is a multi-layer substrate, and
a heat conductive material is provided on the rear surface, and heat conducted from the plurality of thermal vias is conducted to the heat sink through the heat conductive material.

7. An electric power steering device, comprising:
the control unit according to claim 1 mounted on the electric power steering device.

8. The control unit according to claim 1, wherein the number of the plurality of thermal vias ranges from 30 to 40.

\* \* \* \* \*